United States Patent
Ogawa et al.

(10) Patent No.: US 10,192,507 B2
(45) Date of Patent: Jan. 29, 2019

(54) SHIFT REGISTER CIRCUIT AND DISPLAY DEVICE PROVIDED WITH SAME

(71) Applicant: SHARP KABUSHIKI KAISHA, Sakai, Osaka (JP)

(72) Inventors: Yasuyuki Ogawa, Sakai (JP); Kaoru Yamamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/552,802

(22) PCT Filed: Feb. 16, 2016

(86) PCT No.: PCT/JP2016/054374
§ 371 (c)(1),
(2) Date: Aug. 23, 2017

(87) PCT Pub. No.: WO2016/136528
PCT Pub. Date: Sep. 1, 2016

(65) Prior Publication Data
US 2018/0240429 A1    Aug. 23, 2018

(30) Foreign Application Priority Data
Feb. 23, 2015   (JP) ................ 2015-032984

(51) Int. Cl.
G09G 3/36 (2006.01)
H01L 27/12 (2006.01)
G11C 19/28 (2006.01)

(52) U.S. Cl.
CPC .......... *G09G 3/3677* (2013.01); *G11C 19/28* (2013.01); *H01L 27/124* (2013.01); *G09G 2310/0286* (2013.01)

(58) Field of Classification Search
CPC ............... G09G 3/3677; G09G 5/003; G09G 2310/0286; G09G 2310/08;
(Continued)

(56) References Cited

U.S. PATENT DOCUMENTS 9,922,611 B2 *  3/2018  Zhao .................... G02F 1/13
2005/0008114 A1  1/2005  Moon et al.
(Continued)

FOREIGN PATENT DOCUMENTS

JP  2005-050502 A  2/2005
JP  2012-134475 A  7/2012

*Primary Examiner* — Nelson Rosario
(74) *Attorney, Agent, or Firm* — ScienBiziP, P.C.

(57) ABSTRACT

A shift register circuit can achieve high definition of a display device with the smallest possible number of elements without causing defective operation.
A unit circuit is provided with a thin film transistor functioning as an output control transistor; a thin film transistor precharging an internal node based on an on-level signal outputted from an output terminal of a previous stage; two thin film transistors provided in series with each other between the output terminal of the previous stage and the internal node of this stage; a thin film transistor provided between the internal node and an output terminal; and a thin film transistor pulling down the output terminal. The thin film transistors go to an on state only for a quarter period of a clock cycle which is a part of a period during which the output terminal of the previous stage is pulled down.

16 Claims, 21 Drawing Sheets

(58) Field of Classification Search
CPC ...... G09G 2330/021; G09G 3/20; G09G 3/36; G09G 2310/0291; G11C 19/287; G11C 19/28
See application file for complete search history.

(56) References Cited

U.S. PATENT DOCUMENTS

2012/0138922 A1   6/2012  Yamazaki et al.
2014/0043304 A1*  2/2014  Yamashita ........... G11C 19/184
                                                         345/204

* cited by examiner

SHIFT REGISTER CIRCUIT AND DISPLAY DEVICE PROVIDED WITH SAME

TECHNICAL FIELD

The present invention relates to a shift register circuit and a display device including the shift register circuit, and more specifically to a shift register circuit for driving scanning signal lines disposed in a display unit of a display device.

BACKGROUND ART

In recent years, in a display device such as a liquid crystal display device, providing a gate driver (a scanning signal line drive circuit) for driving gate bus lines (scanning signal lines) in a monolithic manner has been more common. Conventionally, a gate driver is in many cases mounted at the periphery of a substrate which forms a display panel, as an IC (Integrated Circuit) chip. However, in recent years, a case in which the gate driver is directly formed on the substrate has been gradually increasing. Such a gate driver is called a "monolithic gate driver", etc. In a display device including a monolithic gate driver, conventionally, a thin film transistor using amorphous silicon (a-Si) is typically adopted as a drive element. However, in recent years, a thin film transistor using polycrystalline silicon, microcrystalline silicon, an oxide semiconductor (e.g., an indium gallium zinc oxide), etc., has started to be adopted as a drive element. Particularly, by adopting a thin film transistor using an oxide semiconductor as a drive element, low power consumption and high definition are achieved.

Meanwhile, in a display unit of an active matrix-type display device there are formed pixel circuits including a plurality of source bus lines (video signal lines); a plurality of gate bus lines; and a plurality of pixel formation portions provided at the respective intersections of the plurality of source bus lines and the plurality of gate bus lines. The plurality of pixel formation portions are arranged in a matrix form and thereby form a pixel array. For example, in a liquid crystal display device, each pixel formation portion includes a thin film transistor which is a switching element connected at its gate terminal to a gate bus line passing through a corresponding intersection, and connected at its source terminal to a source bus line passing through the intersection; a pixel capacitance for holding a pixel voltage value; and the like. In addition, the liquid crystal display device is provided with the above-described gate driver and a source driver (video signal line drive circuit) for driving the source bus lines.

A video signal representing a pixel voltage value is transmitted through a source bus line. Each source bus line cannot transmit video signals representing pixel voltage values for a plurality of rows at the same time (simultaneously). Due to this, writing (charging) of video signals to the pixel capacitances in the above-described pixel formation portions arranged in a matrix form is sequentially performed row by row. Hence, the gate driver is composed of a shift register circuit including a plurality of stages so that the plurality of gate bus lines can be sequentially selected for a predetermined period of time. Then, by sequentially outputting active scanning signals from the respective stages of the shift register circuit (hereinafter, a circuit that forms each stage of the shift register circuit is referred to as a "unit circuit"), writing of video signals to the pixel capacitances is sequentially performed row by row as described above.

FIG. 21 is a circuit diagram showing the simplest configuration of a conventional unit circuit. The unit circuit includes four thin film transistors M81 to M84 and one bootstrap capacitor Cb. In addition, the unit circuit has three input terminals 81 to 83 and one output terminal 88, in addition to input terminals for a low-level direct-current power supply potential VSS. Here, an input terminal that receives an input signal S is provided with reference character 81, an input terminal that receives a clock signal CKA is provided with reference character 82, an input terminal that receives a reset signal R is provided with reference character 83, and an output terminal that outputs an output signal Q is provided with reference character 88. A source terminal of the thin film transistor M81, a drain terminal of the thin film transistor M82, a gate terminal of the thin film transistor M83, and one end of the bootstrap capacitor Cb are connected to each other. Note that a region (wiring line) in which they are connected to each other is referred to as an "internal node". The internal node is provided with reference character VC.

In a configuration such as that described above, when the clock signal CKA changes from a low level (off level) to a high level (on level) with the internal node VC being precharged, the potential of the internal node VC greatly increases due to the bootstrapping effect by the bootstrap capacitor Cb, by which a large voltage is applied to the gate terminal of the thin film transistor M83. By this, the high-level clock signal CKA passes through the thin film transistor M83 and is provided to the output terminal 88, with its level maintained. In this manner, a gate bus line connected to the output terminal 88 of the unit circuit goes into a selected state.

However, since the clock signal CKA repeats clock operation, noise of the clock signal CKA (clock noise) may get mixed in the internal node VC due to the presence of a parasitic capacitance in the thin film transistor M83 during a period (hereinafter, referred to as an "unselected period") during which the gate bus line connected to the output terminal 88 of the unit circuit should be maintained in an unselected state. When the potential of the internal node VC increases thereby, a leakage current flows through the thin film transistor M83, increasing the potential of the output terminal 88. As a result, defective operation occurs.

In view of this, in general, in order to prevent the occurrence of defective operation, circuit elements for drawing the potential of the internal node VC and the potential of the output terminal 88 to a low level at appropriate timing are provided in the unit circuit. However, in recent years, there has been growing demand for high definition and a narrow picture-frame. For example, implementation of a high-definition panel with a resolution over 400 ppi and a narrow picture-frame panel with a picture frame less than 1 mm is sought. In view of this, a configuration such as that shown in FIG. 22 is proposed as a configuration of a unit circuit (of a shift register circuit) that takes measures against clock noise with a relatively small number of circuit elements.

A unit circuit shown in FIG. 22 is characterized by including a thin film transistor M94 that controls an electrical connection state between an internal node VC and an output terminal 98 based on a clock signal CKA; and a thin film transistor M93 that controls an electrical connection state between the internal node VC and an input terminal 91 based on a clock signal CKB of the opposite phase to the clock signal CKA. In such a configuration, during a period during which the clock signal CKA is at a high level, the thin film transistor M94 goes into an on state and the internal node VC and the output terminal 98 go into an electrically connected state. In addition, during a period during which the clock signal CKA is at a low level, the thin film transistor M93 goes into an on state and the internal node VC and the input terminal 91 go into an electrically connected state. In this manner, an increase in the potential of the internal node VC caused by clock noise is suppressed.

PRIOR ART DOCUMENT

Patent Document

[Patent Document 1] Japanese Laid-open Patent Publication No. 2005-050502

SUMMARY OF THE INVENTION

Problems to be Solved by the Invention

However, according to the configuration shown in FIG. 22, defective operation may occur in a case in which a thin film transistor M95 has depression characteristics, which will be described below with reference to FIG. 23. Here, an internal node VC of an nth stage is focused on. Note that a signal provided to an (n−1)th stage as a clock signal CKA and a signal provided to the nth stage as a clock signal CKB are identical signals, and a signal provided to the (n−1)th stage as a clock signal CKB and a signal provided to the nth stage as a clock signal CKA are identical signals.

In a case in which a thin film transistor M95 has depression characteristics, in the (n−1)th stage, when the clock signal CKA goes to a high level, a leakage current flows through the thin film transistor M95. By this, the potential of an output terminal 98 of the (n−1)th stage increases. At this time, in the nth stage, since the clock signal CKB is at a high level, a thin film transistor M93 goes into an on state. By this, the above-described leakage current flows into the internal node VC of the nth stage (see an arrow indicated by reference character 901 in FIG. 23). In addition, since a reset signal (an output signal outputted from an output terminal 98 of a subsequent stage) R is provided to a gate terminal of a thin film transistor M96 in each unit circuit, the thin film transistor M96 goes into an on state only once during one vertical scanning period. Therefore, it cannot be expected that the internal node VC of the nth stage is pulled down through the thin film transistor M96 of the (n−1)th stage (see an arrow indicated by reference character 902 in FIG. 23). Thus, by the above-described leakage current flowing through the nth stage from the (n−1)th stage, the potential of the internal node VC of the nth stage increases. By the repetition of the same operation, large noise is provided to a later stage. As described above, according to the configuration shown in FIG. 22, defective operation may occur.

An object of the present invention is therefore to implement a shift register circuit capable of achieving high definition of a display device with the smallest possible number of elements and without causing defective operation.

Means for Solving the Problems

A first aspect of the present invention is directed to a shift register circuit including a plurality of stages for driving a plurality of scanning signal lines disposed in a display unit of a display device, wherein
a unit circuit that forms each of the stages includes:
an internal node;
an output node connected to a corresponding scanning signal line;
an output control transistor having a control terminal connected to the internal node, a first conductive terminal to which an output control clock signal is provided, and a second conductive terminal connected to the output node;
an internal node precharging unit configured to precharge the internal node based on an on-level signal outputted from an output node of a preceding stage;
an internal node pulling down unit configured to pull down the internal node; and
an output node pulling down unit configured to pull down the output node, and
the internal node pulling down unit:
pulls down the internal node of this stage by electrically connecting the internal node of this stage to the output node of the previous stage during at least a part of a period during which the output node of the previous is pulled down; and
allows the internal node of this stage and the output node of the previous stage to be electrically disconnected from each other throughout a period during which an output control clock signal is at an on level, the output control clock signal being provided to a first conductive terminal of an output control transistor of the previous stage.

According to a second aspect of the present invention, in the first aspect of the present invention,
the internal node pulling down unit pulls down the internal node for about a quarter period of a clock cycle, based on a plurality of clock signals with different phases, the plurality of clock signals being included in four-phase clock signals.

According to a third aspect of the present invention, in the second aspect of the present invention,
the internal node pulling down unit includes two transistors connected in series with each other between the internal node of this stage and the output node of the previous stage.

According to a fourth aspect of the present invention, in the third aspect of the present invention,
the internal node pulling down unit includes, as the two transistors,
a first internal node pull-down transistor having a control terminal to which a clock signal of an opposite phase to the output control clock signal that is provided to the first conductive terminal of the output control transistor of the previous stage is provided; and
a second internal node pull-down transistor having a control terminal to which a clock signal delayed in phase by 90 degrees relative to the output control clock signal that is provided to the first conductive terminal of the output control transistor of the previous stage is provided.

According to a fifth aspect of the present invention, in the fourth aspect of the present invention,
the output node pulling down unit pulls down the output node for about a half period of a clock cycle, based on the clock signal of the opposite phase to the output control clock signal.

According to a sixth aspect of the present invention, in the fifth aspect of the present invention,
the output node pulling down unit includes an output node pull-down transistor having a control terminal to which the clock signal of the opposite phase to the output control clock signal is provided, a first conductive terminal connected to the output node, and a second conductive terminal to which the output control clock signal is provided.

According to a seventh aspect of the present invention, in the first aspect of the present invention, the unit circuit that forms each of the stages further includes a third internal node pull-down transistor having a first conductive terminal connected to the internal node and a second conductive terminal connected to the output node.

According to an eighth aspect of the present invention, in the seventh aspect of the present invention, the output control clock signal is provided to a control terminal of the third internal node pull-down transistor.

According to a ninth aspect of the present invention, in the first aspect of the present invention, the internal node precharging unit precharges the internal node based on a signal representing a level of an internal node of a stage located two stages before this stage and a signal outputted from the output node of the previous stage.

According to a tenth aspect of the present invention, in the first aspect of the present invention, the internal node precharging unit includes an internal node precharge transistor having a control terminal and a first conductive terminal that are connected to the output node of the previous stage, and a second conductive terminal connected to the internal node of this stage.

According to an eleventh aspect of the present invention, in the first aspect of the present invention, the unit circuit that forms each of the stages further includes an initializing unit configured to pull down both the internal node and the output node, According to a twelfth aspect of the present invention, in the eleventh aspect of the present invention, the initializing unit includes:

a first initialization transistor having a control terminal to which an initialization signal is provided, a first conductive terminal connected to the internal node, and a second conductive terminal connected to the output node; and a second initialization transistor having a control terminal to which the initialization signal is provided, a first conductive terminal connected to the output node, and a second conductive terminal to which the output control clock signal is provided.

According to a thirteenth aspect of the present invention, in the first aspect of the present invention, the output control transistor is a thin film transistor having a channel layer formed of an oxide semiconductor.

A fourteenth aspect of the present invention is directed to a display device including a shift register circuit according to the first aspect of the present invention.

A fifteenth aspect of the present invention is directed to a shift register circuit including a plurality of stages for driving a plurality of scanning signal lines disposed in a display unit of a display device, wherein a unit circuit that forms each of the stages includes:

an internal node;

an output node connected to a corresponding scanning signal line;

an output control transistor having a control terminal connected to the internal node, having a first conductive terminal to which an output control clock signal is provided, and a second conductive terminal connected to the output node;

an internal node precharging unit configured to precharge the internal node based on an on-level signal outputted from an output node of a preceding stage;

an internal node pulling down unit configured to pull down the internal node; and an output node pulling down unit configured to pull down the output node, and the internal node pulling down unit:

includes a clock terminal configured to receive a clock signal that is provided, as an output control clock signal, to a first conductive terminal of an output control transistor of the previous stage;

pulls is down the internal node by electrically connecting the internal node to the clock terminal during at least a part of a period during which the output control clock signal provided to the first conductive terminal of the output control transistor of the previous stage is at an off level; and allows the internal node and the clock terminal to be electrically disconnected from each other throughout a period during which the output control clock signal provided to the first conductive terminal of the output control transistor of the previous stage is at an on level.

A sixteenth aspect of the present invention is directed to a display device including a shift register circuit according to the fifteenth aspect of the present invention.

Effects of the Invention

According to the first aspect of the present invention, during a period during which an output control clock signal is at an on level in a given stage, an output node of the stage and an internal node of a subsequent stage are in an electrically disconnected state. Hence, even in a case in which an output control transistor has depression characteristics, a leakage current occurring in the output control transistor does not affect the operation of a unit circuit of the subsequent stage. In addition, when an internal node of a given stage and an output node of a previous stage are electrically connected to each other, the output node of the previous stage is pulled down. Hence, regardless of clock noise of the previous stage or noise occurring in the output node of the previous stage, the pulling down of the internal node of the given stage is securely performed. By the above, a shift register circuit that can suppress the occurrence of defective operation caused by noise such as clock noise is implemented with a relatively simple configuration.

According to the second aspect of the present invention, the same effect as that of the first aspect of the present invention is obtained.

According to the third aspect of the present invention, a shift register circuit capable of achieving high definition of a display device with a small number of elements and without causing defective operation is implemented.

According to the fourth aspect of the present invention, the same effect as that of the third aspect of the present invention is obtained.

According to the fifth aspect of the present invention, since the output node is pulled down every half clock cycle in each unit circuit, the occurrence of defective operation caused by noise is suppressed.

According to the sixth aspect of the present invention, the occurrence of defective operation caused by noise can be suppressed while reducing the number of terminals provided to a unit circuit.

According to the seventh aspect of the present invention, by bringing the internal node and the output node into an electrically connected state as needed during an unselected period, the output control transistor can be maintained in an off state during the unselected period. By this, a deterioration in the characteristics of the output control transistor is suppressed.

According to the eighth aspect of the present invention, since the internal node and the output node go into an electrically connected state at timing at which the potential of the internal node is about to increase, a deterioration in the characteristics of the output control transistor is effectively suppressed.

According to the ninth aspect of the present invention, the internal node in the unit circuit is charged without through a diode-connected transistor. Hence, a charging voltage of the internal node before performing bootstrap operation gets very high. By this, a sufficient voltage margin is secured, enabling to improve the reliability of the display device.

According to the tenth aspect of the present invention, current leakage from the internal node is prevented when bootstrap operation is performed.

According to the eleventh aspect of the present invention, all unit circuits can be initialized (charge in the internal nodes and in the output nodes can be removed), for example, immediately before the operation of the shift register circuit starts or immediately after the operation of the shift register circuit ends. By this, a deterioration in the characteristics of a transistor in a unit circuit is suppressed, and stable circuit operation regarding the shift register circuit is implemented.

According to the twelfth aspect of the present invention, a deterioration in the characteristics of a transistor in a unit circuit can be suppressed with a small number of circuit elements.

According to the thirteenth aspect of the present invention, low power consumption and high definition can fee achieved.

According to the fourteenth aspect of the present invention, a display device including a shift register circuit that provides the effect of the first aspect of the present invention is implemented.

According to the fifteenth aspect of the present invention, by controlling, as appropriate, an electrical connection state between an internal node and a clock terminal that receives a clock signal which is provided, as an output control clock signal, to a first conductive terminal of an output control transistor of a previous stage, the pulling down of the internal node is securely performed even when noise occurs. In addition, the load on the output node of each unit circuit decreases. By this, the operating voltage margin can be increased, improving the reliability of the shift register circuit.

According to the sixteenth aspect of the present invention, a display device including a shift register circuit that provides the effect of the fifteenth aspect of the present invention is implemented.

MODES FOR CARRYING OUT THE INVENTION

Embodiments of the present invention will be described below with reference to the accompanying drawings. Note that, in the following description, a gate terminal (gate electrode) of a thin film transistor corresponds to a control terminal, a drain terminal (drain electrode) thereof corresponds to a first conductive terminal, and a source terminal (source electrode) thereof corresponds to a second conductive terminal. In addition, description is made assuming that all thin film transistors provided in a shift register are n-channel thin film transistors. In addition, although, in general, one of a drain and a source with a higher potential is called a drain, in the description of this specification, one is defined as a drain and the other as a source and thus a source potential may be higher than a drain potential.

1. First Embodiment

<1.1 Overall Configuration and Operation>

Figure 2:
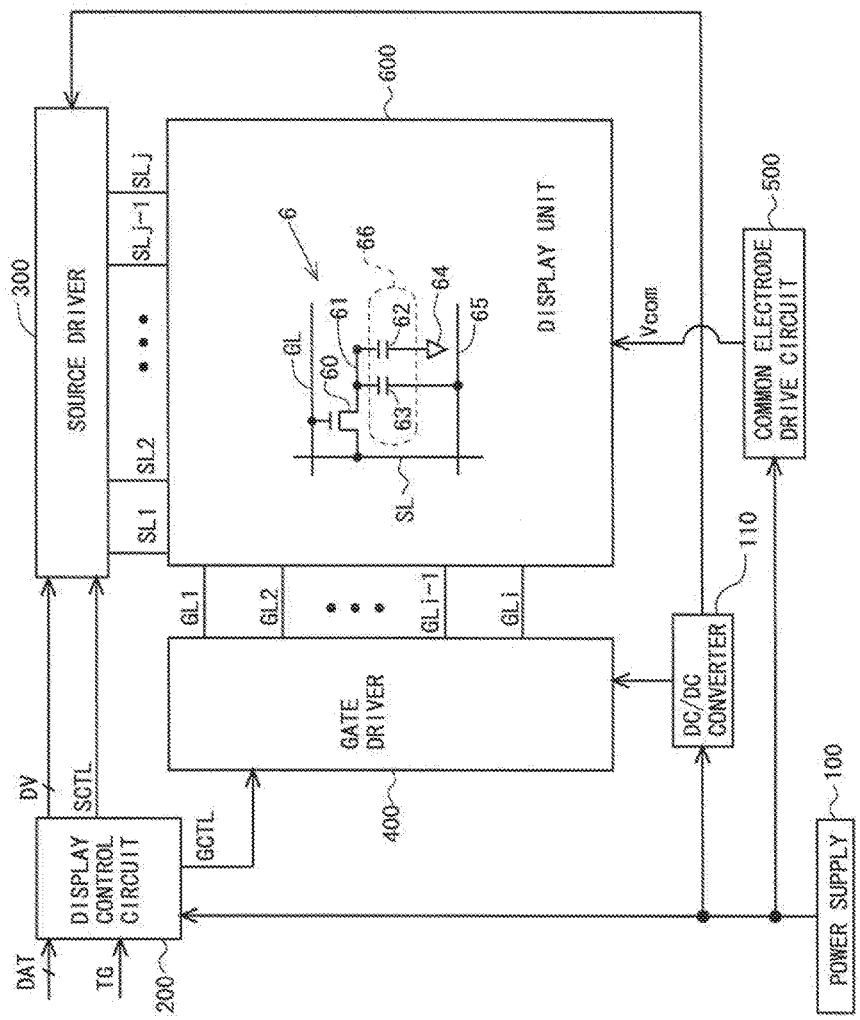
FIG. 2 is a block diagram showing an overall configuration of the liquid crystal display device in the first embodiment.

FIG. 2 is a block diagram showing an overall configuration of an active matrix-type liquid crystal display device according to a first embodiment of the present invention. As shown in FIG. 2, the liquid crystal display device includes a power supply 100, a DC/DC converter 110, a display control circuit 200, a source driver (video signal line drive circuit) 300, a gate driver (scanning signal line drive circuit) 400, a common electrode drive circuit 500, and a display unit 600. Note that the gate driver 400 is formed on a display panel including the display unit 600, using amorphous silicon, polycrystalline silicon, microcrystalline silicon, an oxide semiconductor (e.g., an indium gallium zinc oxide), etc. That is, in the present embodiment, the gate driver 400 and the display unit 600 are formed on the same substrate (an array substrate which is one of two substrates forming a liquid crystal panel).

In the display unit 600 there are disposed a plurality of (j) source bus lines (video signal lines) SL1 to SLj and a plurality of (i) gate bus lines (scanning signal lines) GL1 to GLi. Pixel formation portions 6 that form pixels are provided at the respective intersections of the source bus lines SL1 to SLj and the gate bus lines GL1 to GLi. That is, the display unit 600 includes the plurality of (i×j) pixel formation portions 6. The plurality of pixel formation portions 6 are arranged in a matrix form and thereby form a pixel matrix of i rows×j columns. Each pixel formation portion 6 includes a TFT 60 which is a switching element connected at its gate terminal to a gate bus line GL passing through a corresponding intersection, and connected at its source terminal to a source bus line SL passing through the intersection; a pixel electrode 61 connected to a drain terminal of the TFT 60; a common electrode 64 and an auxiliary capacitance electrode 65 which are provided so as to be shared by the plurality of pixel formation portions 6; a liquid crystal capacitance 62 formed by the pixel electrode 61 and the common electrode 64; and an auxiliary capacitance 63 formed by the pixel electrode 61 and the auxiliary capacitance electrode 65. By the liquid crystal capacitance 62 and the auxiliary capacitance 63, a pixel capacitance 66 is formed. Note that in the display unit 600 in FIG. 2, only the components of one pixel formation portion 6 are shown.

The power supply 100 supplies a predetermined power supply voltage to the DC/DC converter 110, the display control circuit 200, and the common electrode drive circuit 500. The DC/DC converter 110 generates, from the power supply voltage, a predetermined direct-current voltage for allowing the source driver 300 and the gate driver 400 to operate, and supplies the predetermined direct-current voltage to the source driver 300 and the gate driver 400. The common electrode drive circuit 500 provides a predetermined potential Vcom to the common electrode 64.

The display control circuit 200 receives an image signal DAT and a timing signal group TG, such as a horizontal synchronizing signal and a vertical synchronizing signal, which are transmitted from an external source, and outputs digital video signals DV, source control signals SCTL for controlling the operation of the source driver 300, and gate control signals GCTL for controlling the operation of the gate driver 400. Typically, the source control signals SCTL include a source start pulse signal, a source clock signal, a latch strobe signal, etc. In addition, typically, the gate control signals GCTL include a gate start pulse signal, a gate clock signal, etc.

The source driver 300 receives the digital video signals DV and the source control signals SCTL which are outputted from the display control circuit 200, and applies driving video signals to the respective source bus lines SL. At this time, the source driver 300 sequentially holds a digital video signal DV representing a voltage to be applied to a corresponding source bus line SL, at timing at which a pulse of the source clock signal occurs. Then, the held digital video signal DV is converted into an analog voltage at timing at which a pulse of the latch strobe signal occurs. The converted analog voltages are simultaneously applied to all source bus lines SL as driving video signals.

The gate driver 400 repeats application of active scanning signals to the respective gate bus lines GL, based on the gate control signals GCTL outputted from the display control circuit 200, with one vertical scanning period being a cycle. Note that a detailed description about the gate driver 400 will be made later.

By applying the driving video signals to the source bus lines SL1 to SLj and applying the scanning signals to the gate bus lines GL1 to GLi in the above-described manner, an image based on the image signal DAT transmitted from the external source is displayed on the display unit 600. Note that in the following a scanning signal applied to each gate bus line is provided with the same reference character as the gate bus line. For example, a scanning signal applied to a gate bus line SL1 of the first row is provided with reference character GL1.

Meanwhile, in the present embodiment, the TFTs 60 in the display unit 600 are all n-channel TFTs. In addition, in the present embodiment, an oxide TFT (a thin film transistor using an oxide semiconductor for a channel layer) is adopted for the TFTs 60. Note, however, that the present invention does not exclude use of TFTs other than an oxide TFT.

An oxide semiconductor layer included in an oxide TFT will be described below. The oxide semiconductor layer is, for example, an In—Ga—Zn—O-based semiconductor layer. The oxide semiconductor layer includes, for example, an In—Ga—Zn—O-based semiconductor. The In—Ga—Zn—O-based semiconductor is a ternary oxide of In (indium), Ga (gallium), and Zn (zinc). The proportions (composition ratio) of In, Ga, and Zn are not particularly limited. For example, the proportions may be such that In:Ga:Zn=2:2:1, In:Ga:Zn=1:1:1, or In:Ga:Zn=1:1:2.

A TFT having an In—Ga—Zn—O-based semiconductor layer has high mobility (mobility over 20 times compared to an amorphous silicon TFT) and a low leakage current (a leakage current less than $\frac{1}{100}$ compared to an amorphous silicon TFT), and thus is suitably used as a TFT 60 in the display unit 600. By using the TFT having an In—Ga—Zn—O-based semiconductor layer, the power consumption of the display device can be significantly reduced.

The In—Ga—Zn—O-based semiconductor may be amorphous and may include crystalline portions and have crystalline properties. A crystalline In—Ga—Zn—O-based semiconductor is preferably a crystalline In—Ga—Zn—O-based semiconductor in which a c-axis is aligned nearly vertically to layer surfaces. A crystalline structure of such an In—Ga—Zn—O-based semiconductor is disclosed in, for example, Japanese Laid-open Patent Publication No. 2012-134475.

The oxide semiconductor layer may include another oxide semiconductor instead of an In—Ga—Zn—O-based semiconductor. For example, a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semi conductor, an In—Sn—Zn—O-based semiconductor (e.g., $In_2O_3$—$SnO_2$—ZnO), or an In—Ga—Sn—O-based semiconductor may be included.

<1.2 Configuration and Operation of the Gate Driver>

Figure 3:
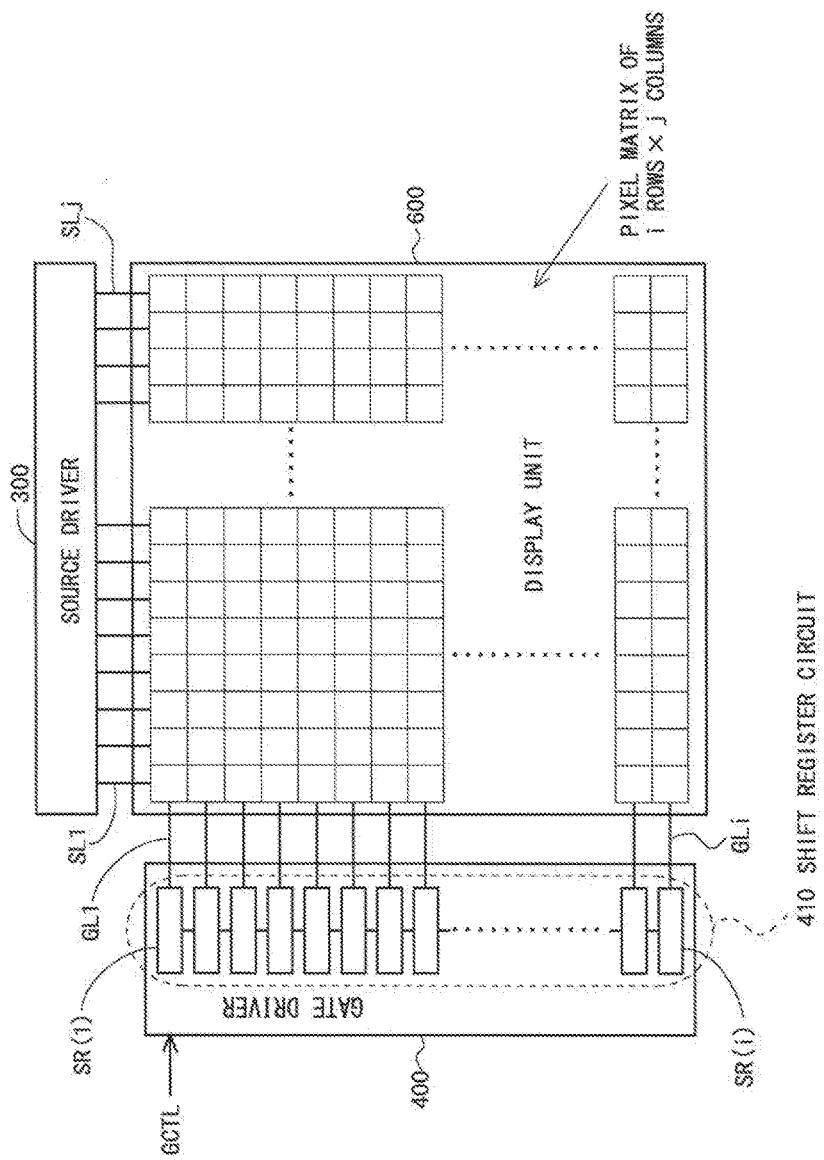
FIG. 3 is a block diagram for describing a configuration of the gate driver in the first embodiment.

Next, with reference to FIGS. 3 to 5, an overview of the configuration and operation of the gate driver 400 in the present embodiment will be described. As shown in FIG. 3, the gate driver 400 is composed of a shift register circuit 410 including a plurality of stages. A pixel matrix of i rows×j columns is formed in the display unit 600, and the stages (unit circuits) of the shift register circuit 410 are provided so as to have a one-to-one correspondence with the rows of the pixel matrix. That is, the shift register circuit 410 is composed of i unit circuits SR(1) to SR(i). Each unit circuit SR is connected to a corresponding gate bus line GL.

Figure 4:
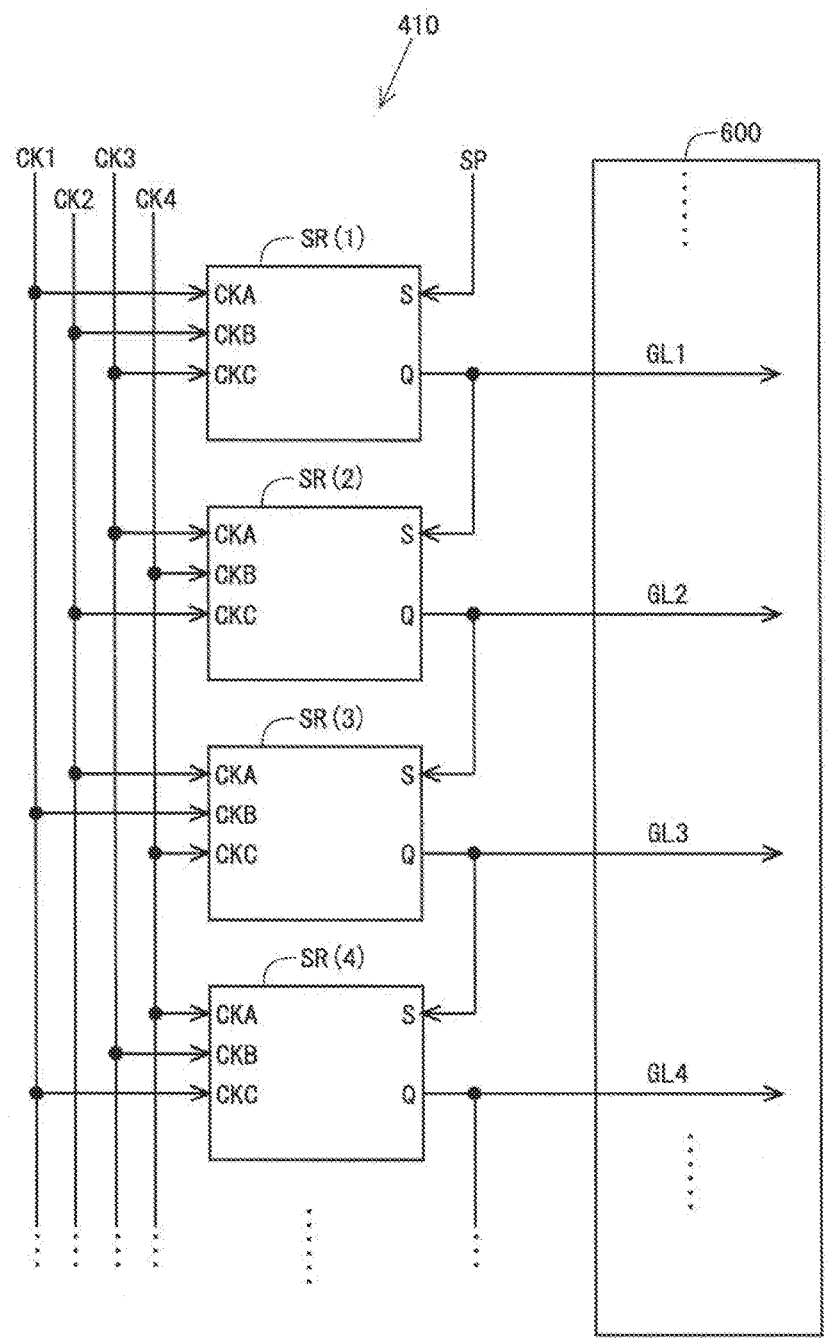
FIG. 4 is a block diagram showing a configuration of the shift register circuit that forms the gate driver in the first embodiment.
Figure 5:
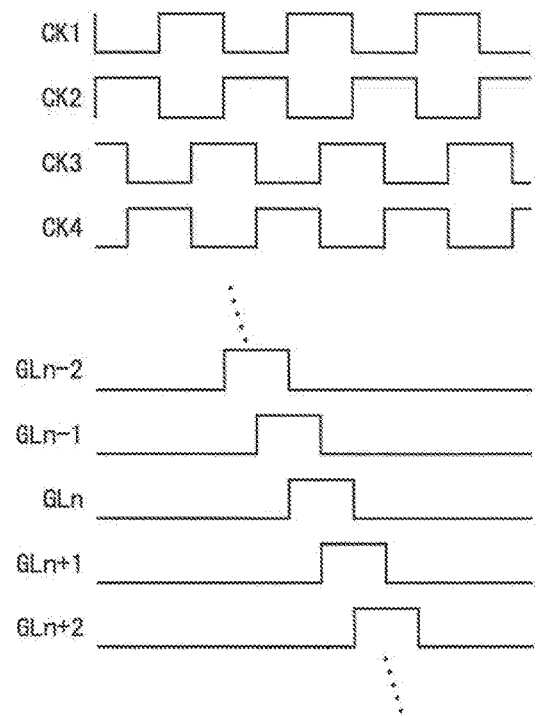
FIG. 5 is a signal waveform diagram for describing the operation of the gate driver in the first embodiment.

FIG. 4 is a block diagram showing a configuration of the shift register circuit 410 that forms the gate driver 400 in the present embodiment. As described above, the shift register circuit 410 is composed of the i unit circuits SR(1) to SR(i). Note that FIG. 4 shows unit circuits SR(1) to SR(4) of the first to fourth stages. Each unit circuit SR is provided with an input terminal for receiving a clock signal CKA; an input terminal for receiving a clock signal CKB; an input terminal for receiving a clock signal CKC; an input terminal for receiving an input signal S; and an output terminal for outputting an output signal Q. Note that although each unit circuit SR is also provided with an input terminal for a low-level direct-current power supply potential VSS as will be described later, the input terminal is omitted in FIG. 4 (the same also applies to FIG. 8).

As gate clock signals, four-phase clock signals CK1 to CK4 are provided to the shift register circuit 410. As shown in FIG. 5, the clock signal CK1 and the clock signal CK2 are shifted in phase by 180 degrees relative to each other, and the clock signal CK3 and the clock signal CK4 are shifted in phase by 180 degrees relative to each other. The clock signal CK1 is advanced in phase by 90 degrees relative to the clock signal CK3. In addition, the duty cycles of all clock signals CK1 to CK4 are approximately 50 percent.

Next, input and output, signals to/from each stage (each unit circuit) of the shift register circuit 410 will be described. The clock signals are inputted to each unit circuit SR as described below (see FIG. 4). For the unit circuit SR(1) of the first stage, the clock signal CK1 is provided as the clock signal CKA, the clock signal CK2 is provided as the clock signal CKB, and the clock signal CK3 is provided as the clock signal CKC. For the unit circuit SR(2) of the second stage, the clock signal CK3 is provided as the clock signal CKA, the clock signal CK4 is provided as the clock signal CKB, and the clock signal CK2 is provided as the clock signal CKC. For the unit circuit SR(3) of the third stage, the clock signal CK2 is provided as the clock signal CKA, the clock signal CK1 is provided as the clock signal CKB, and the clock signal CK4 is provided as the clock signal CKC. For the unit circuit SR(4) of the fourth stage, the clock signal CK4 is provided as the clock signal CKA, the clock signal CK3 is provided as the clock signal CKB, and the clock signal CK1 is provided as the clock signal CKC. A configuration such as that described above is repeated every four stages throughout all stages of the shift register circuit 410. An output signal Q is outputted from each unit circuit SR. In addition, to each of the unit circuits SR(2) to SR(i) of all stages except for the first stage is provided an output signal Q outputted from a previous stage as an input signal S. To the unit circuit SR(1) of the first stage is provided a gate start pulse signal SP as an input signal S.

In a configuration such as that described above, when a pulse of the gate start pulse signal SP which is provided, as the input signal S, to the unit circuit SR(1) of the first stage of the shift register circuit 410 rises, a pulse included in the gate start pulse signal SP (the pulse is included in the output signal Q outputted from the unit circuit SR of each stage) is sequentially transferred from the unit circuit SR(1) of the first stage to the unit circuit SR(i) of the ith stage, based on the clock signals CK1 to CK4. Then, in accordance with the pulse transfer, the output signals Q outputted from the unit circuits SR(1) to SR(i) of the first to ith stages sequentially go to a high level. Then, the output signals Q outputted from the unit circuits SR(1) to SR(i) of the first to ith stages are provided to the gate bus lines GL1 to GLi as scanning signals GL1 to GLi. By this, the scanning signals GL which sequentially go to a high level (active) as shown in FIG. 5 are provided to the gate bus lines GL in the display unit 600.

<1.3 Configuration of the Unit Circuits>

Figure 1:
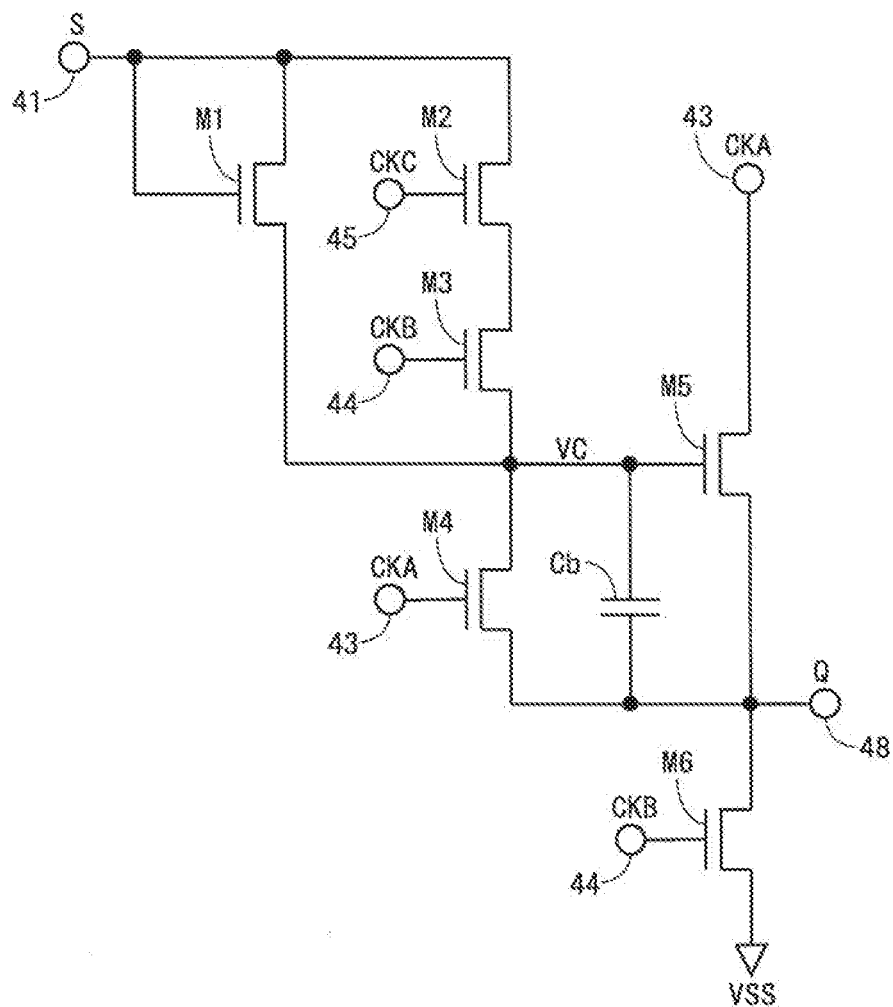
FIG. 1 is a circuit diagram showing a configuration of a unit circuit included in a shift register circuit (a configuration of a portion of the shift register circuit for one stage) in a gate driver in a liquid crystal display device according to a first embodiment of the present invention.

FIG. 1 is a circuit diagram showing a configuration of a unit circuit SR (a configuration of a portion of the shift register circuit 410 for one stage) in the present embodiment. As shown in FIG. 1, the unit circuit SR includes six thin film transistors M1 to M6 and one bootstrap capacitor Cb. In addition, the unit circuit SR has four input terminals 41, 43, 44, and 45 and one output terminal (output node) 48, in addition to an input terminal for a low-level, direct-current power supply potential VSS. Here, an input terminal that receives an input signal S is provided with reference character 41, input terminals that receive a clock signal CKA are provided with reference character 43, input terminals that receive a clock signal CKB are provided with reference character 44, an input terminal that receives a clock signal CKC is provided with reference character 45, and an output terminal that outputs an output signal Q is provided with reference character 48. Note that although the clock signal CKB is provided to both a gate terminal of the thin film transistor M3 and a gate terminal of the thin film transistor M6, FIG. 1 separately shows the input terminals 44 for the clock signal CKB for convenience sake. Likewise, although the clock signal CKA is provided to both a gate terminal of the thin film transistor M4 and a drain terminal of the thin film transistor M5, FIG. 1 separately shows the input terminals 43 for the clock signal CKA for convenience sake.

Next, a connection relationship between the components in the unit circuit SR will be described. A source terminal of the thin film transistor M1, a drain terminal of the thin film transistor M3, a drain terminal of the thin film transistor M4, a gate terminal of the thin film transistor M5, and one end of the bootstrap capacitor Cb are connected to each other through an internal node VC.

The thin film transistor M1 is connected at its gate terminal and drain terminal to the input terminal 41 (i.e., diode-connected) and connected at its source terminal to the internal node VC. The thin film transistor M2 is connected at its gate terminal to the input terminal 45, connected at its drain terminal to a source terminal of the thin film transistor M3, and connected at its source terminal to the input terminal 41. The thin film transistor M3 is connected at its gate terminal to the input terminal 44, connected at its drain terminal to the internal node VC, and connected at its source terminal to the drain terminal of the thin film transistor M2. The thin film transistor M4 is connected at its gate terminal to the input terminal 43, connected at its drain terminal to the internal node VC, and connected at its source terminal to the output terminal 48. The thin film transistor M5 is connected at its gate terminal to the internal node VC, connected at its drain terminal to the input terminal 43, and connected at its source terminal to the output terminal 48. The thin film transistor M6 is connected at its gate terminal to the input terminal 44, connected at its drain terminal to the output terminal 48, and connected at its source terminal to the input terminal for a low-level direct-current power supply potential VSS. The bootstrap capacitor Cb is connected at its one end to the gate terminal of the thin film transistor M5 and connected at its other end to the source terminal of the thin film transistor M5.

Note that in the present embodiment, an internal node precharging unit is implemented by the thin film transistor M1, an internal node pulling down unit is implemented by the thin film transistor M2 and the thin film transistor M3, and an output node pulling down unit is implemented by the thin film transistor M6. In addition, an internal node precharge transistor is implemented by the thin film transistor M1, a first internal node pull-down transistor is implemented by the thin film transistor M3, a second internal node pull-down transistor is implemented by the thin film transistor M2, a third internal node pull-down transistor is implemented by the thin film transistor M4, an output control transistor is implemented by the thin film transistor M5, and an output node pull-down transistor is implemented by the thin film transistor M6.

<1.4 Operation of the Unit Circuits>

Figure 6:
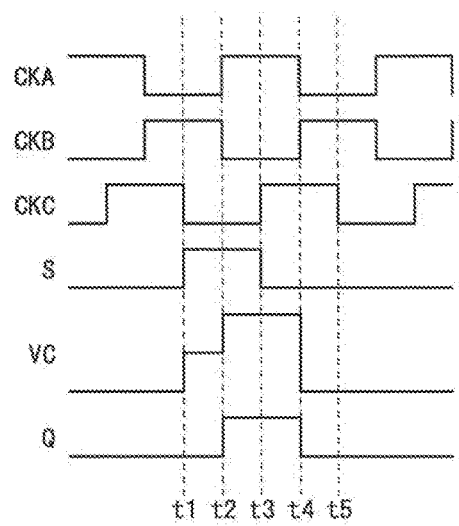
FIG. 6 is a signal waveform diagram for describing the operation of the unit circuit in the first embodiment.

Next, with reference to FIGS. 1 and 6, the operation of a unit circuit SR of the present embodiment will be described. Here, a unit circuit of an nth stage is focused on. Note that, in FIG. 6, a period from time point t2 to time point t4 is a period (selected period) during which charging based on driving video signals is to be performed on pixel formation portions 6 of an nth row.

During a period before time point t1, the potential of the input signal S, the potential of the internal node VC, and the potential of the output signal Q are maintained at a low level. At time point t1, an output signal Q outputted from the unit circuit SR(n−1) of the (n−1)th stage changes from a low level to a high level. That is, in the unit circuit SR(n) of the nth stage, the input signal S changes from a low level to a high level, by this, the thin film, transistor M1 goes into an on state, and during a period from t1 to t2 the bootstrap capacitor Cb is charged and the potential of the internal node VC increases. Note that a charging voltage at this time is a voltage lower by a threshold voltage of the thin film transistor M1 than the voltage of the input signal S.

At time point t2, the clock signal CKA changes from a low level to a high level. By this, with an increase in the potential of the input terminal 43, the drain potential of the thin film transistor M5 increases. At this time, since the thin film transistor M5 is in an on state, the potential of the output signal Q (the potential of the output terminal 48) also increases. When the potential of the output terminal 48 increases, the potential of the internal node VC also increases through the bootstrap capacitor Cb (the internal node VC goes into a boosted state). As a result, a large voltage is applied to the gate terminal of the thin film transistor M5, and the high-level clock signal CKA passes through the thin film transistor M5 and is provided to the output terminal 48, with its level maintained. By this, the output signal Q goes to a high level. Then, a state in which the output signal Q is at a high level is maintained until time point t4. Note that in the present embodiment since the thin film transistor M1 is configured in a diode connection mode, current leakage from the internal node VC through the thin film transistor M1 is prevented when bootstrap operation is performed.

At time point t3, the input signal S changes from a high level to a low level. In addition, at time point t3, the clock signal CKC changes from a low level to a high level. By this, the thin film transistor M2 goes into an on state. At this time point t3, since the clock signal CKB is at a low level, the thin film transistor M3 is in an off state. Therefore, the thin film transistor M2 going into an on state does not affect the state of the internal node VC.

At time point t4, the clock signal CKA changes from a high level to a low level. At this time, since the thin film transistor M5 is in an on state, the potential of the output signal Q (the potential of the output terminal 48) decreases with a decrease in the potential of the input terminal 43. By the decrease in the potential of the output terminal 48, the potential of the internal node VC also decreases through the bootstrap capacitor Cb. In addition, at time point t4, the clock signal CKB changes from a low level to a high level. By this, the thin film transistors M6 and M3 go into an on state. By the thin film transistor M6 going into an on state, the potential of the output signal Q is drawn to a low level. In addition, during a period from t4 to t5, both the thin film transistor M3 and the thin film transistor M2 are in an on state. Therefore, the potential of the internal node VC is drawn to the level of the input signal S obtained during a period from t4 to t5, i.e., a low level.

Figure 7:
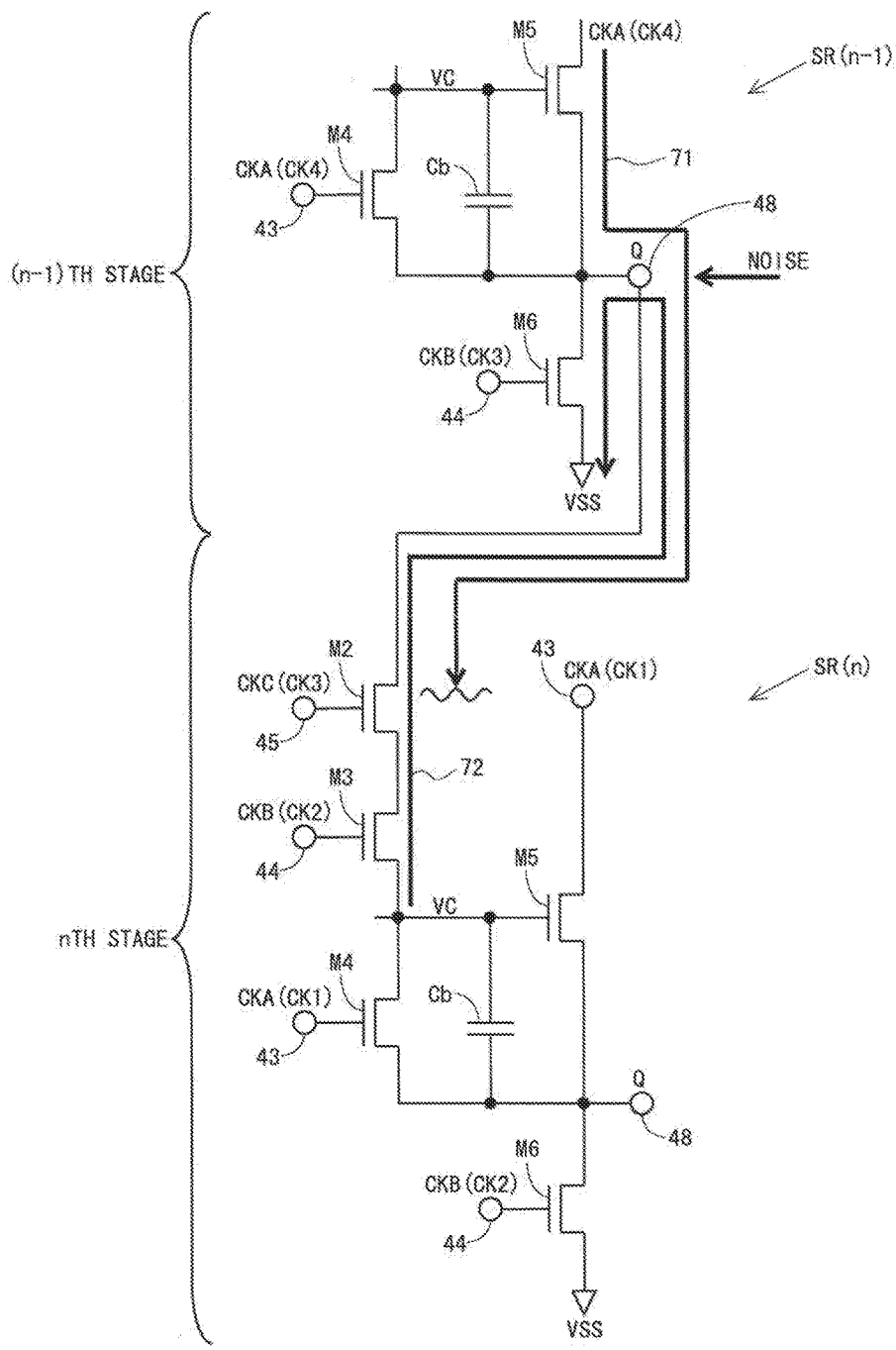
FIG. 7 is a diagram for describing the operation of unit circuits performed when a clock signal CKA goes to a high level during an unselected period in the first embodiment.

Now, with reference to FIG. 7, the operation of unit circuits SR performed when the clock signal CKA goes to a high level during an unselected period (a period other than the period from t2 to t4) will be described. Note that it is assumed that to the nth stage is provided the clock signal CK1 as a clock signal CKA, is provided the clock signal CK2 as a clock signal CKB, and is provided the clock signal CK3 as a clock signal CKC, and to the (n−1)th stage is provided the clock signal CK4 as a clock signal CKA, is provided the clock signal CK3 as a clock signal CKB, and is provided the clock signal CK1 as a clock signal CKC.

In a case in which a thin film transistor M5 has depression characteristics, when the clock signal CK4 goes to a high level, a leakage current flows through the thin film transistor MB of a unit circuit SR(n−1) of the (n−1)th stage. By this, the potential of an output terminal 48 of the unit circuit SR(n−1) of (n−1)th stage increases. At this time, since the clock signal CK3 is at a low level during a period during which the clock signal CK4 is at a high level as can be grasped from FIG. 5, a thin film transistor M2 of a unit circuit SR(n) of the nth stage is in an off state. Therefore, the leakage current at the thin film transistor M5 of the unit circuit SR(n−1) of the (n−1)th stage does not affect the operation of the unit circuit SR(n) of the nth stage (see an arrow indicated by reference character 71 in FIG. 7).

In other words, when a given stage is focused on, an internal node VC of the given stage and an output terminal 48 of a previous stage are in an electrically disconnected state throughout a period during which an output control clock signal provided to the drain terminal (first conductive terminal) of a thin film transistor M5 (output control transistor) of the previous stage is at an on level. Hence, a leakage current occurring in the thin film transistor M5 of the previous stage does not affect the operation of a unit circuit SR of the given stage.

In addition, when noise occurs in a gate bus line GLn−1 of the (n−1)th row due to the presence of a coupling capacitance between a gate bus line GL and a source bus line SL, etc., the noise attempts to get mixed in through the output terminal 48 of the unit circuit SR(n−1) of the (n−1)th stage. However, when the thin film transistor M2 of the unit circuit SR(n) of the nth stage is in an on state, a thin film transistor M6 of the unit circuit SR(n−1) of the (n−1)th stage is also in an on state, and thus, drawing to a low level through the thin film transistor M6 of the unit circuit SR(n−1) of the (n−1)th stage is securely performed (see an arrow indicated by reference character 72 in FIG. 7).

Accordingly, an internal node VC of the unit circuit SR(n) of the nth stage is not affected by the noise.

In other words, when a given stage is focused on, during at least a part of a period during which the output terminal 48 of the previous stage is pulled down, the internal node of the given stage is pulled down by electrically connecting the internal node VC of the given stage to the output terminal 48 of a previous stage. Hence, regardless of noise occurring in the previous stage, the pulling down of the internal node VC of the given stage is securely performed.

Furthermore, in the unit circuit SR(n) of the nth stage, when the clock signal CKA goes to a high level, a thin film transistor M4 goes into an on state. By thus bringing the internal node VC and an output terminal 48 into an electrically connected state as needed during an unselected period, an increase in the potential of the internal node VC due to a coupling capacitance between the gate terminal (internal node VC) and drain terminal (first conductive terminal) of a thin, film transistor M5 can be prevented. That is, the thin film transistor M5 can be maintained in an off state during the unselected period. By this, a malfunction of the shift register can be prevented and a deterioration in the characteristics of the thin film transistor M5 is prevented.

Moreover, both a thin film transistor M3 and the thin film transistor M2 go into an on state for a quarter period of a clock cycle. That is, during the unselected period, the potential of the internal node VC is drawn to a low level every quarter clock cycle. By this, the occurrence of defective operation caused by clock noise is effectively suppressed.

<1.5 Effect>

According to the present embodiment, even when a thin film transistor M5 which functions as an output control transistor has depression characteristics and a leakage current flows through the thin film transistor M5 in a given stage, the leakage current does not affect the operation of a unit circuit of a subsequent stage. In addition, even when noise is mixed in through an output terminal 48 of a given stage, the pulling down of an internal node VC of a subsequent stage is performed through a thin film transistor M6 of the given stage. Hence, the noise mixed in through the output terminal 48 of the given stage does not affect the operation of the unit circuit of the subsequent stage. In addition, since the thin film transistor M5 can be maintained in an off state during an unselected period, a deterioration in the characteristics of the thin film transistor M5 is prevented. In addition, since the potential of the internal node VC is drawn to a low level as needed during the unselected period, the occurrence of defective operation caused by clock noise is effectively suppressed. Here, each unit circuit SR is composed of six thin film transistors M1 to M6 and one bootstrap capacitor Cb. By the above, according to the present embodiment, a shift register circuit capable of achieving high definition of a display device with a small number of elements and without causing defective operation is implemented.

2. Second Embodiment

<2.1 Configuration>

Figure 8:
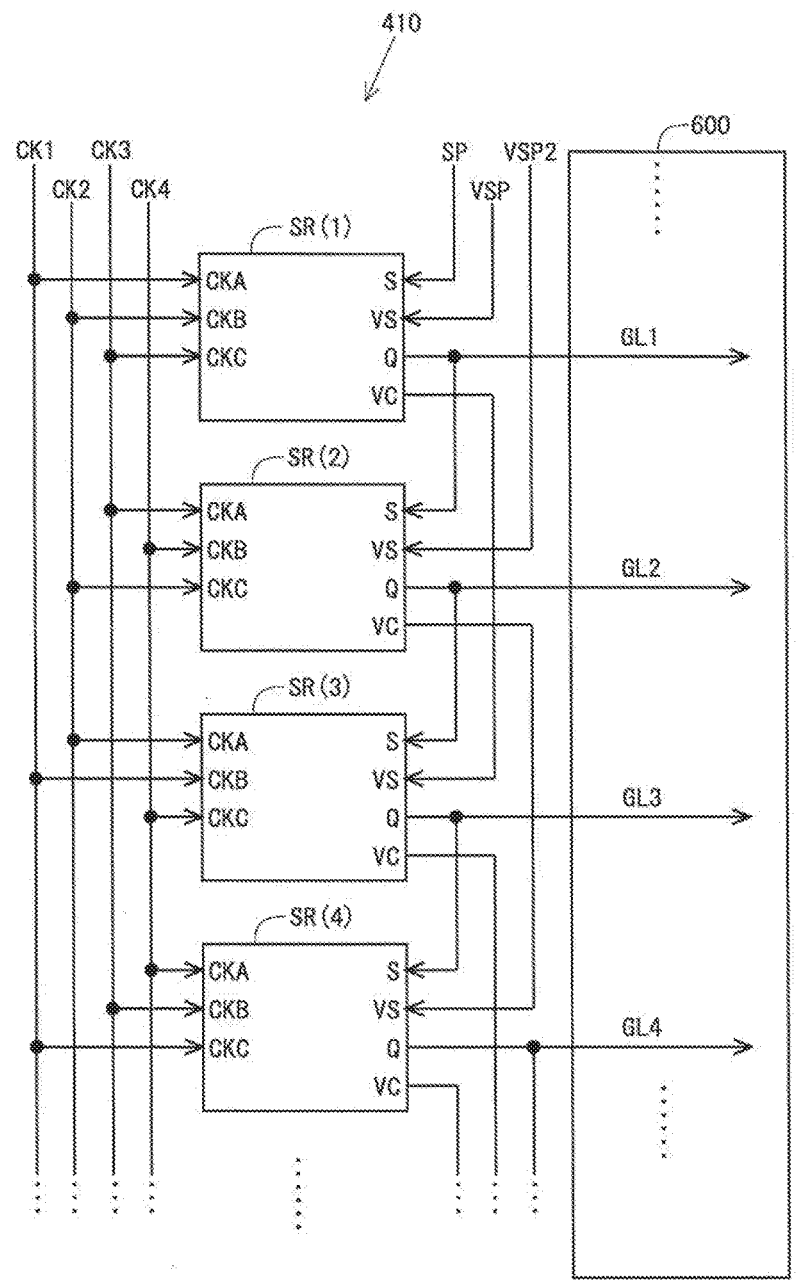
FIG. 8 is a block diagram showing a configuration of a shift register circuit that forms a gate driver in a second embodiment of the present invention.

A second embodiment of the present invention will be described. An overall configuration and an overview of operation are the same as those of the above-described first embodiment and thus description thereof is omitted (see FIG. 2). FIG. 8 is a block diagram showing a configuration of a shift register circuit 410 that forms a gate driver 400 in the present embodiment. Each unit circuit SR is provided with an input terminal for receiving an input signal VS and an output terminal for outputting an output signal VC, in addition to the input and output terminals provided in the above-described first embodiment (see FIG. 4). Note that the output signal VC is a signal representing the level of an internal node VC.

An output signal VC outputted from each unit circuit SR is provided, as an input signal VS, to a stage located two stages after the unit circuit SR. Note, however, that to a unit circuit SR(1) of the first stage is provided a gate start pulse signal VSP as an input signal VS, and to a unit circuit SR(2) of the second stage is provided a gate start pulse signal VSP2 as an input signal VS.

In a configuration such as that described above, as in the above-described first embodiment, scanning signals GL which sequentially go to a high level (active) are provided to the gate bus lines GL in the display unit 600.

Figure 9:
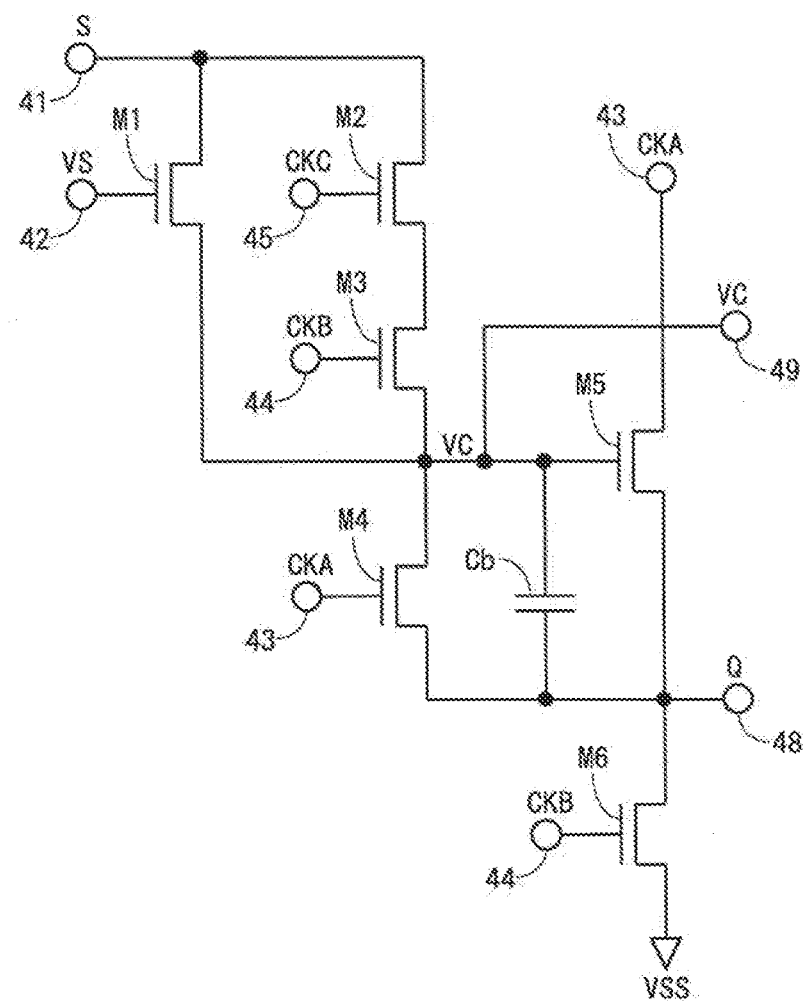
FIG. 9 is a circuit diagram showing a configuration of a unit circuit (a configuration of a portion of the shift register circuit for one stage) in the second embodiment.

FIG. 9 is a circuit diagram showing a configuration of a unit circuit SR (a configuration of a portion of the shift register circuit 410 for one stage) in the present embodiment. In the above-described first embodiment, an input signal S (an output signal Q of a previous stage) is provided to the gate terminal of the thin film transistor M1. On the other hand, in the present embodiment, an input signal VS (a signal representing the level of an internal node VC of a stage located two stages before) is provided to the gate terminal of the thin film transistor M1. In addition, there is provided an output terminal 49 for outputting an output signal VC representing the level of an internal node VC. Others are the same as those of the above-described first embodiment.

<2.2 Operation of the Unit Circuits>

Figure 10:
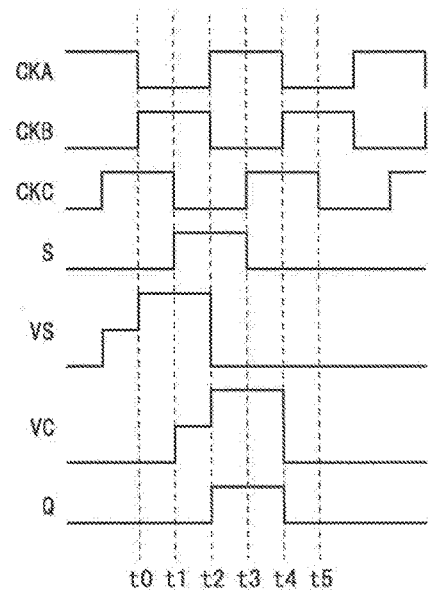
FIG. 10 is a signal waveform diagram for describing the operation of the unit circuit in the second embodiment.

Next, with reference to FIGS. 9 and 10, the operation of a unit circuit SR in the present embodiment will be described. Here, too, a unit circuit of an nth stage is focused on. At time point t0, an internal node VC of a unit circuit SR(n−2) of an (n−2)th stage goes into a boosted state. Therefore, the potential of an input signal VS gets very high as shown in FIG. 10. By this, a thin film transistor M1 goes into an on state.

At time point t1, an output signal Q outputted from a unit circuit SR (n−1) of an (n−1)th stage changes from a low level to a high level. That is, in a unit circuit SR(n) of the nth stage, an input signal S changes from a low level to a high level. Since the thin film transistor M1 is already in an on state, by the change of the input signal S from a low level to a high level, a bootstrap capacitor Cb is charged and the potential of an internal node VC increases. At this time, unlike the above-described first embodiment, a charging voltage is a voltage corresponding to the high-level voltage of clock signals. That is, there is no reduction of an amount of voltage corresponding to the threshold voltage of the thin film transistor M1. At and after time point t2, the unit circuit SR operates in the same manner as in the above-described first embodiment.

<2.3 Effects>

According to the present embodiment, since a thin film transistor M1 in a unit circuit SR is not diode-connected, the charging voltage of an internal node VC before performing bootstrap operation does not depend on the threshold voltage of the thin film transistor M1 and thus is a voltage corresponding to the high-level voltage of the clock signals. A thin film transistor has a characteristic that its threshold voltage fluctuates by the repetitive application of a voltage to the gate terminal; however, even in a state in which the element deterioration of the thin film transistor M2 has progressed, according to the present embodiment, a sufficient voltage margin is secured and thus the reliability of the liquid crystal display device can be improved. Note that the same effect as that of the above-described first embodiment can also be obtained.

3. Third Embodiment

<3.1 Configuration, Etc.>

A third embodiment of the present invention will be described. An overall configuration and an overview of operation are the same as those of the above-described first embodiment and thus description thereof is omitted (see FIG. 2). The configuration of a shift register circuit 410 is the same as that of the above-described second embodiment and thus description thereof is omitted (see FIG. 8).

Figure 11:
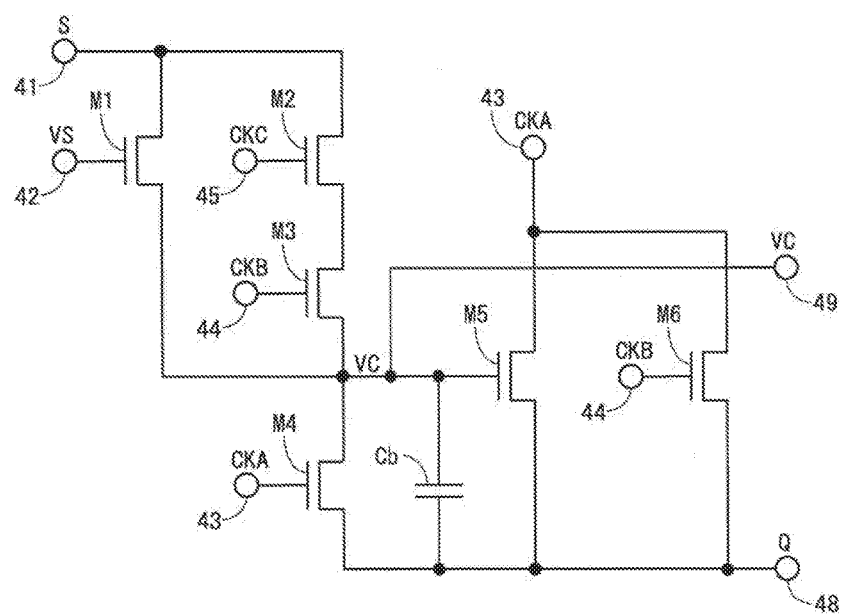
FIG. 11 is a circuit diagram showing a configuration of a unit circuit (a configuration of a portion of a shift register circuit for one stage) in a third embodiment of the present invention.

FIG. 11 is a circuit diagram showing a configuration of a unit circuit SR (a configuration of a portion of the shift register circuit 410 for one stage) in the present embodiment. In the above-described first and second embodiments, the source terminal of a thin film transistor M6 is connected to an input terminal for a low-level direct-current power supply potential VSS. On the other hand, in the present embodiment, the source terminal of the thin film transistor M6 is connected to an input terminal 43 to which a clock signal CKA is provided. Others are the same as those of the above-described second embodiment.

When a clock signal CKB which is provided to the gate terminal of the thin film transistor M6 is at a high level, the clock signal CKA which is provided to the input terminal 43 is at a low level. Therefore, even in a case in which the source terminal of the thin film transistor M6 is connected to the input terminal 43, when the thin film transistor M6 goes into an on state at time point t4 of FIG. 10, the potential of an output signal Q is drawn to a low level. As such, a configuration in which a VSS terminal is removed from the configuration shown in FIG. 9 can be adopted.

<3.2 Effects>

According to the present embodiment, the number of terminals of a unit circuit SR that forms each stage of the shift register circuit 410 can be reduced. In addition, since the number of VSS bus lines (signal lines for a low-level direct-current power supply potential) can be reduced over conventional cases, a liquid crystal display device with a narrower picture-frame is implemented. Taking also into account the fact that the number of terminals of the display device itself can be reduced, the effect of being able to manufacture a more compact display device can be obtained. Note that the same effects as those of the above-described first and second embodiments can also be obtained.

<3.3 Variant>

Figure 12:
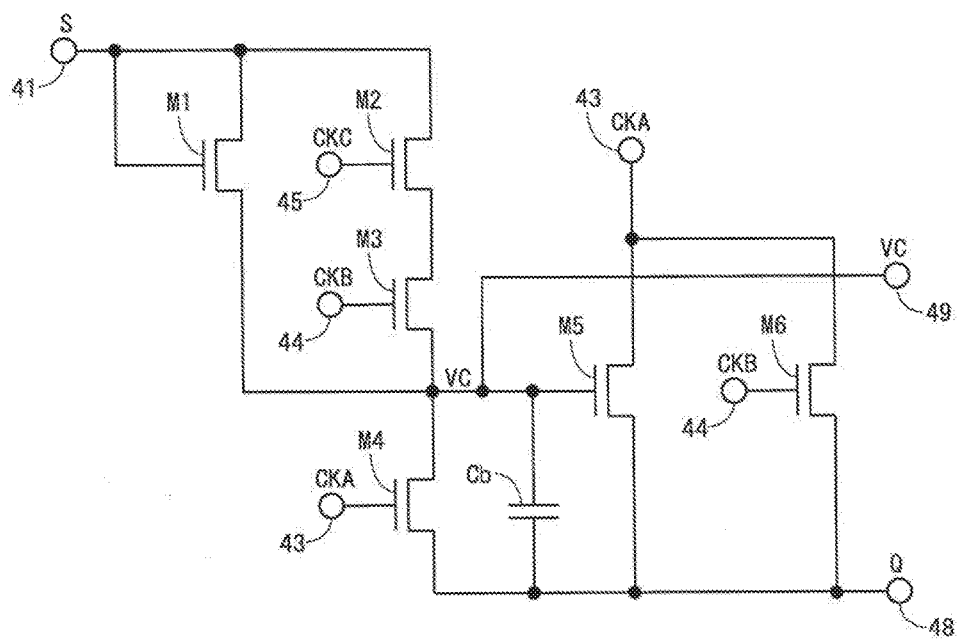
FIG. 12 is a circuit diagram showing a configuration of a unit circuit (a configuration of a port ion of a shift register circuit for one stage) in a variant of the third embodiment.

In the above-described third embodiment, as in the above-described second embodiment, an input signal VS is provided to the gate terminal of a thin film transistor M1. However, a configuration can also be adopted in which, as shown in FIG. 12 and as in the above-described first embodiment, an input signal S is provided to the gate terminal of the thin film transistor M1.

4. Fourth Embodiment

<4.1 Configuration, Etc.>

Figure 13:
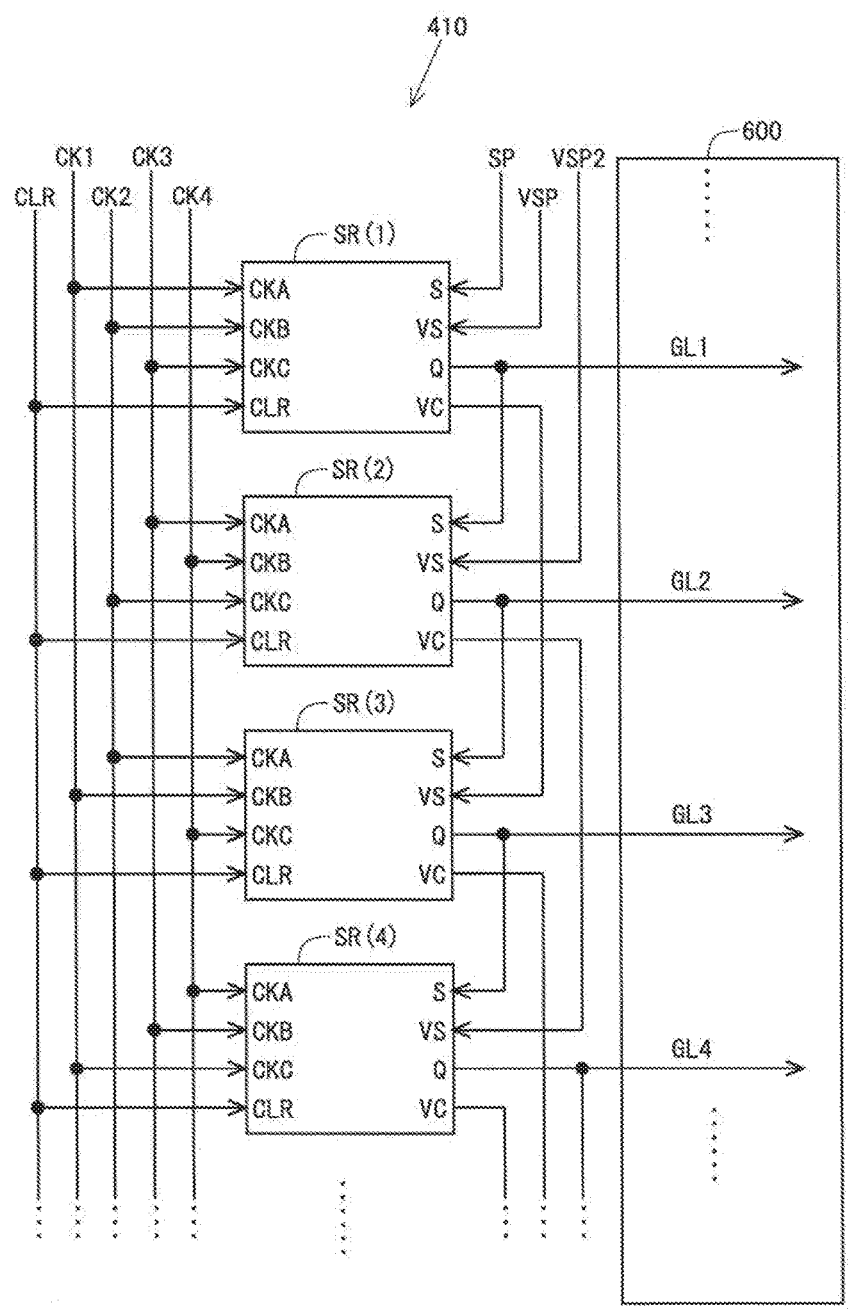
FIG. 13 is a block diagram showing a configuration of a shift register circuit that forms a gate driver in a fourth embodiment of the present invention.

A fourth embodiment of the present invention will be described. An overall configuration and an overview of operation are the same as those of the above-described first embodiment and thus description thereof is omitted (see FIG. 2). FIG. 13 is a block diagram showing a configuration of a shift register circuit 410 that forms a gate driver 400 in the present embodiment. Each unit circuit SR is provided with an input terminal for receiving a clear signal CLR, in addition to the input and output terminals provided in the above-described second embodiment (see FIG. 8). The clear signal CLR is provided to unit circuits SR(1) to SR(i) of all stages in a sharing manner.

Figure 14:
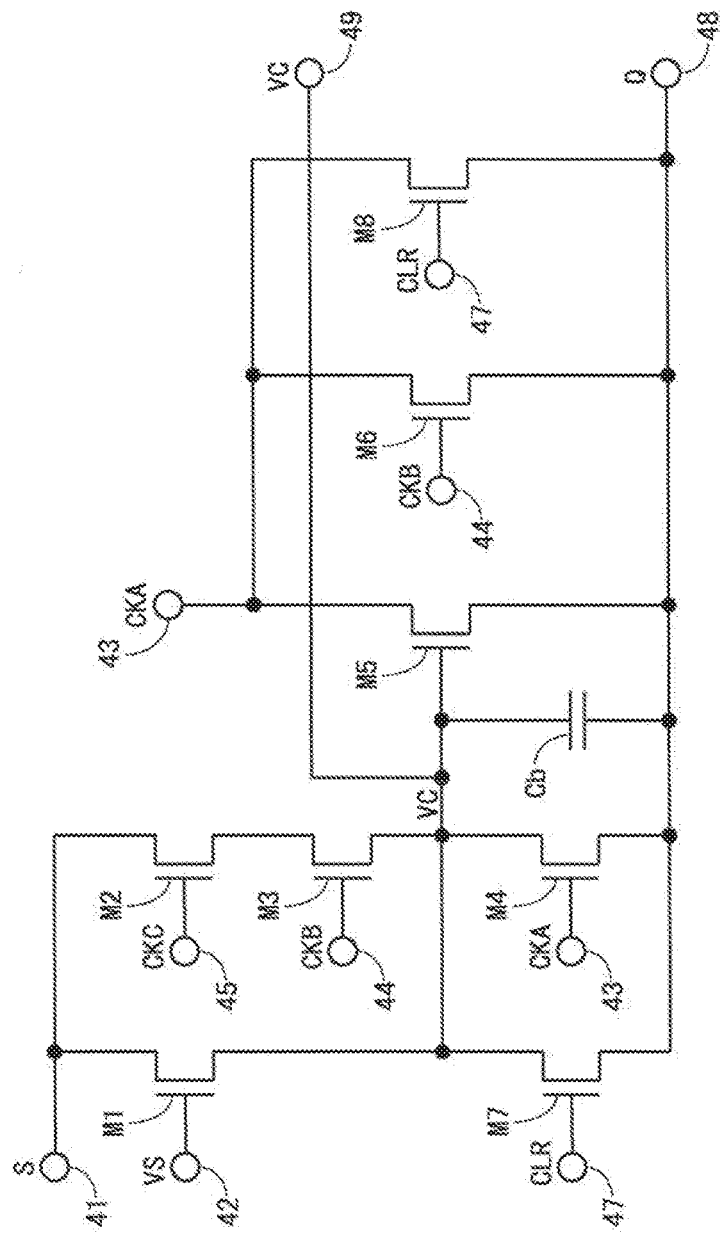
FIG. 14 is a circuit diagram showing a configuration of a unit circuit (a configuration of a portion of the shift register circuit for one stage) in the fourth embodiment.

FIG. 14 is a circuit diagram showing a configuration of a unit circuit SR (a configuration of a portion of the shift register circuit 410 for one stage) in the present embodiment. Note that in FIG. 14 input terminals that receive a clear signal CLR are provided with reference character 47. The unit circuit SR is provided with a thin film transistor M7 and a thin film transistor M8, in addition to the components of the unit circuit SR of the above-described third embodiment (see FIG. 11). The thin film transistor M7 is connected at its gate terminal to an input terminal 47, connected at its drain terminal to an internal node VC, and connected at its source terminal to an output terminal 48. The thin film transistor M8 is connected at its gate terminal to an input terminal 47, connected at its drain terminal to the output terminal 48, and connected at its source terminal to an input terminal 43. Others are the same as those of the above-described third embodiment.

Note that in the present embodiment an initializing unit is implemented by the thin film transistor M7 and the thin film transistor M8. In addition, a first initialization transistor is implemented by the thin film transistor M7, and a second initialization transistor is implemented by the thin film transistor M8.

Figure 15:
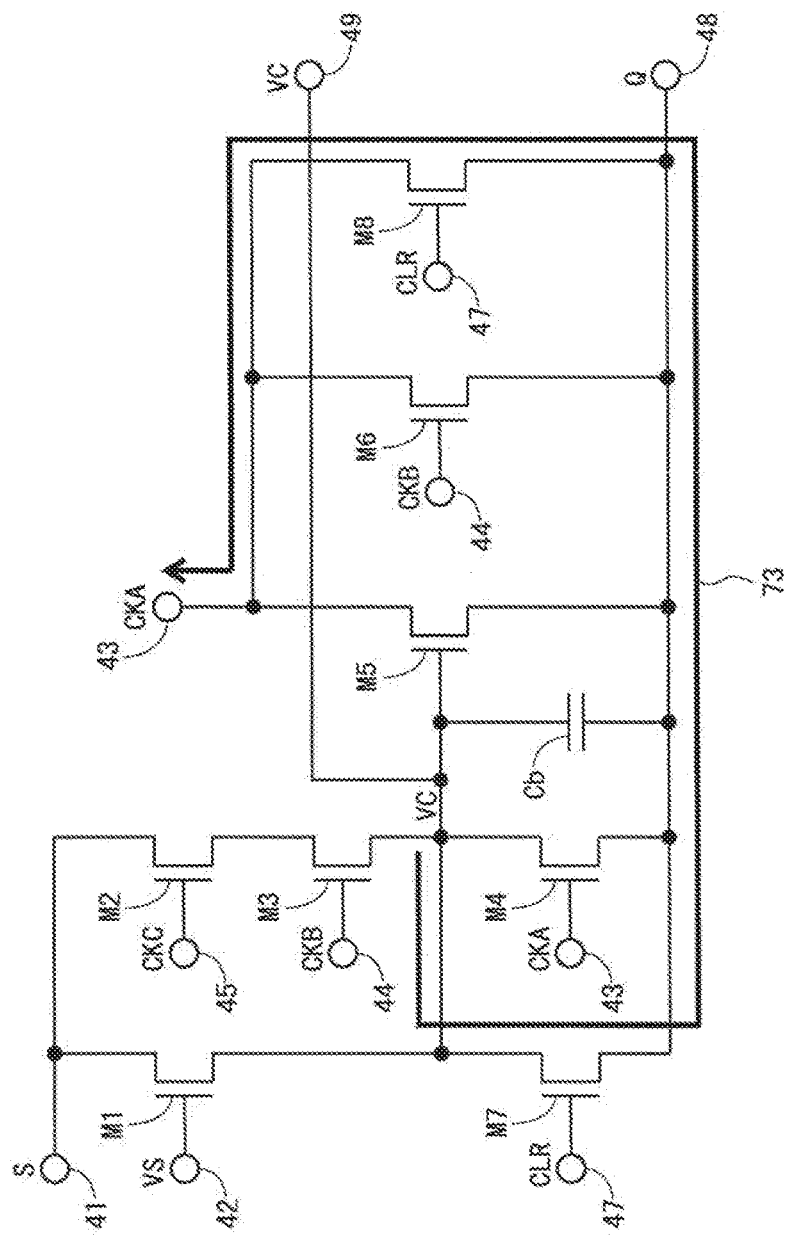
FIG. 15 is a diagram for describing initialization of the unit circuit in the fourth embodiment.

In a configuration such as that described above, the clear signal CLR is brought to a high level for a certain period, for example, immediately before the operation of the shift register circuit 410 starts or immediately after the operation of the shift register circuit 410 ends. When the clear signal CLR goes to a high level, the thin film transistor M7 and the thin film transistor M8 go into an on state. By bringing all clock signals CK1 to CK4 to a low level at this time, in the unit circuits SR(1) to SR(i) of all stages of the shift register circuit 410, a clock signal CKA goes to a low level, and thus, the potential of an internal node VC and the potential of an output signal Q are drawn to a low level (see an arrow indicated by reference character 73 in FIG. 15). In this manner, all unit circuits SR(1) to SR(i) that form the shift register circuit 410 can be initialized.

<4.2 Effects>

A thin film transistor has a characteristic that its threshold voltage fluctuates by the repetitive application of a voltage to the gate terminal. Hence, when a state in which charge is accumulated in an internal node VC continues, the characteristics of the thin film transistor M5 greatly deteriorate. Particularly, in a case in which an oxide TFT with a small off-leakage current is adopted, charge is likely to remain in the internal node VC even after the operation of the device is stopped, and thus, there is a concern about a deterioration in the characteristics of the thin film transistor M5. In this regard, according to the present embodiment, all unit circuits SR(1) to SR(i) can be initialized, for example, immediately before the operation of the shift register circuit 410 starts or immediately after the operation of the shift register circuit 410 ends. By this, a deterioration in the characteristics of a thin film transistor in a unit circuit SR is suppressed, and stable circuit operation regarding the shift register circuit 410 is implemented. In addition, according to the configuration shown in FIG. 14, the internal node VC is the only internal node except for the output terminal 48 (i.e., only one channel), and thus, a configuration for initializing the unit circuit SR can be implemented with a small number of circuit elements. By this, a display device with a narrow picture-frame that is capable of suppressing a deterioration in the characteristics of thin film transistors is implemented. Note that the same effects as those of the above-described first to third embodiments can also be obtained.

<4.3 Variant>

Figure 16:
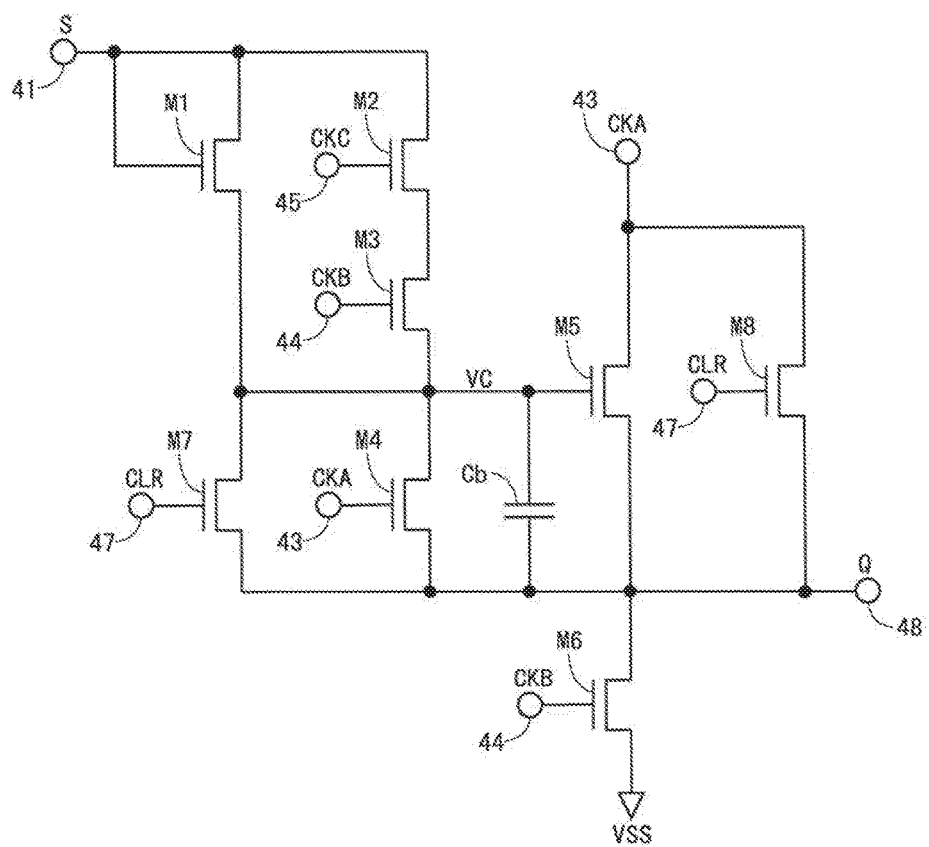
FIG. 16 is a circuit diagram showing a configuration of a unit circuit (a configuration of a portion of a shift register circuit for one stage) in a variant of the fourth embodiment.

A configuration of a unit circuit SR in the above-described fourth embodiment is such that a thin film transistor M7 and a thin film transistor M8 are added to a configuration of a unit circuit SR in the above-described third embodiment (see FIG. 11). However, a configuration can also be adopted in which, as shown in FIG. 16, a thin film transistor M7 and a thin film transistor M8 are added to a configuration of a unit circuit SR in the above-described first embodiment (see FIG. 1).

5. Fifth Embodiment

<5.1 Configuration>

Figure 17:
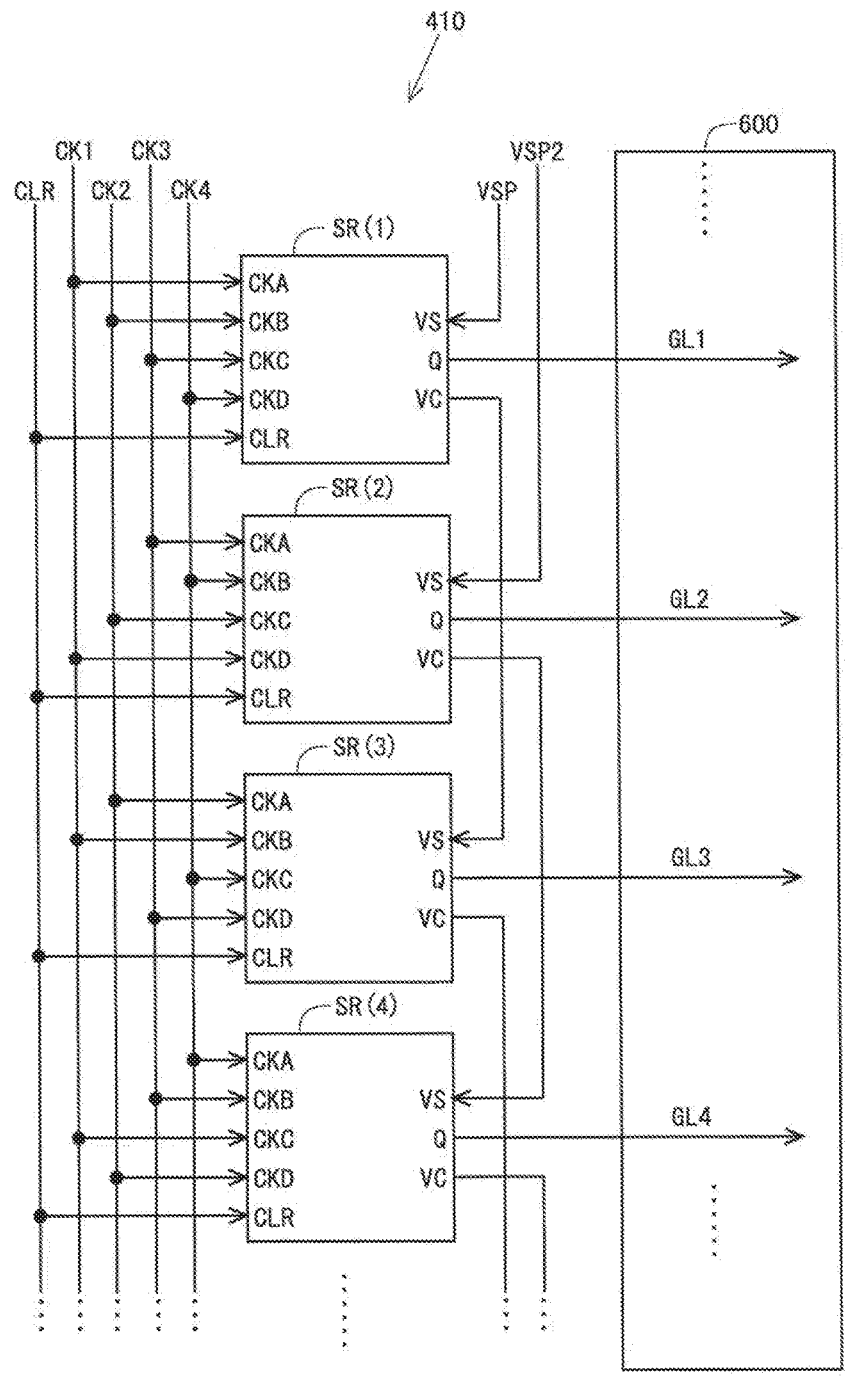
FIG. 17 is a block diagram showing a configuration of a shift register circuit that forms a gate driver in a fifth embodiment of the present invention.

A fifth embodiment of the present invention will be described. An overall configuration and an overview of operation are the same as those of the above-described first embodiment and thus description thereof is omitted (see FIG. 2). FIG. 17 is a block diagram showing a configuration of a shift register circuit 410 that forms a gate driver 400 in the present embodiment. Each unit circuit SR is provided with an input terminal for receiving a clock signal CKD, instead of an input terminal for an input signal S in the above-described fourth embodiment (see FIG. 13). For a unit circuit SR(1) of the first stage, a clock signal CK4 is provided as a clock signal CKD. For a unit circuit SR(2) of the second stage, a clock signal CK1 is provided as a clock signal CKD. For a unit circuit SR(3) of the third stage, a clock signal CK3 is provided as a clock signal CKD. For a unit circuit SR(4) of the fourth stage, a clock signal CK2 is provided as a clock signal CKD. A configuration such as that described above is repeated every four stages throughout all stages of the shift register circuit 410.

Figure 18:
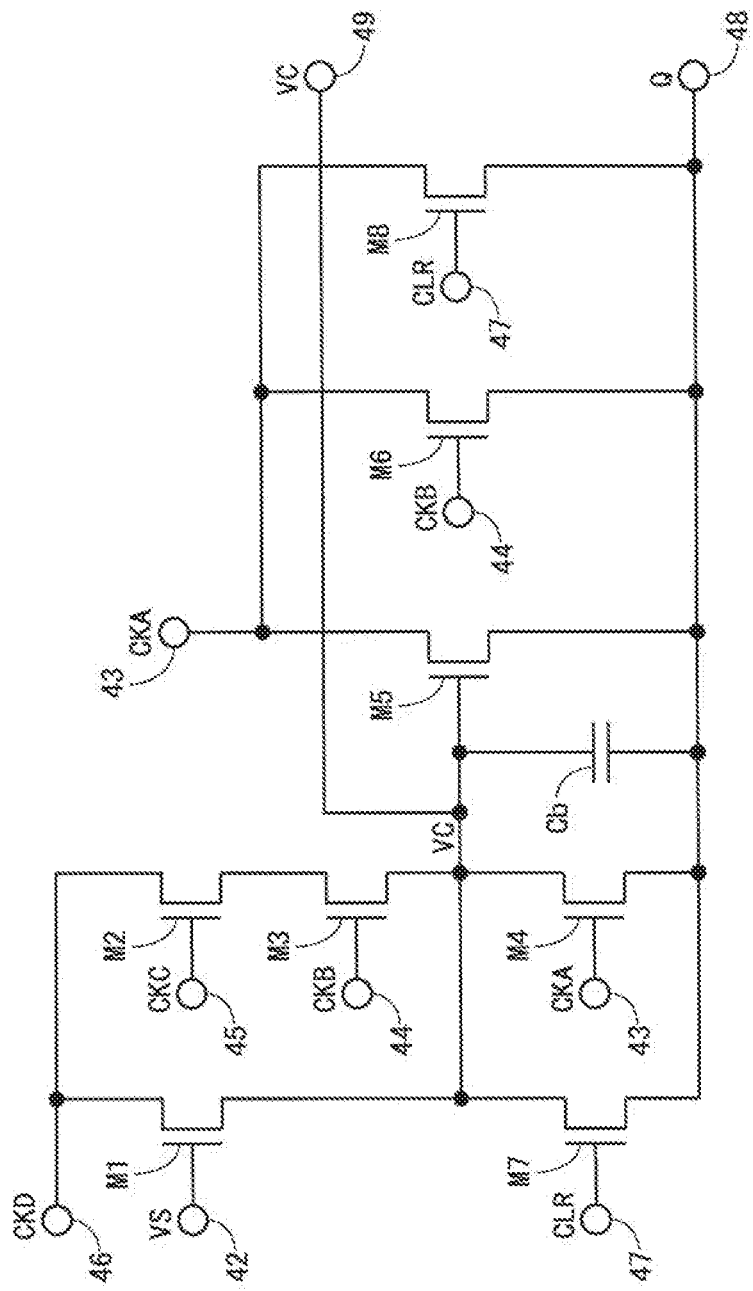
FIG. 18 is a circuit diagram showing a configuration of a unit circuit (a configuration of a portion of the shift register circuit for one stage) in the fifth embodiment.

FIG. 18 is a circuit diagram showing a configuration of a unit circuit SR (a configuration of a portion of the shift register circuit 410 for one stage) in the present embodiment. In the above-described fourth embodiment, an input signal S (an output signal Q of a previous stage) is provided to the drain terminal of a thin film transistor M1 and the source terminal of a thin film transistor M2. On the other hand, in the present embodiment, a clock signal CKD is provided to the drain terminal of the thin film transistor M1 and the source terminal of the thin film transistor M2. Others are the same as those of the above-described fourth embodiment.

<5.2 Operation of the Unit Circuits>

Figure 19:
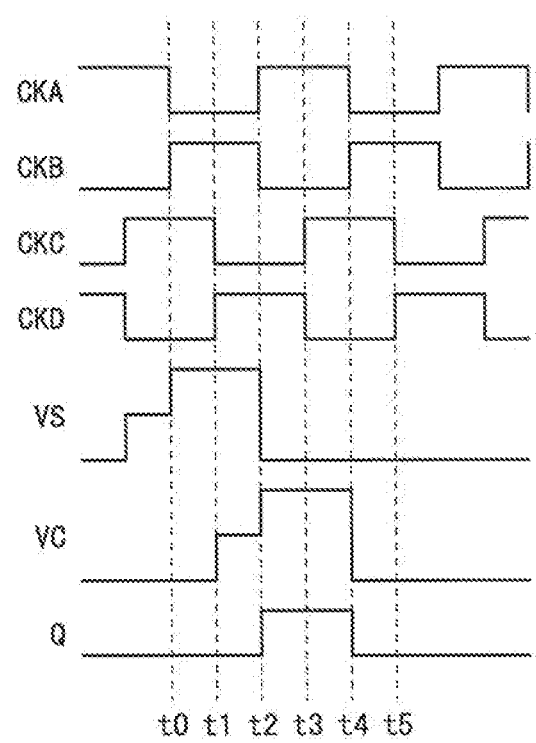
FIG. 19 is a signal, waveform diagram for describing the operation of the unit circuit in the fifth embodiment.

Next, with reference to FIGS. 18 and 19, the operation of a unit circuit SR in the present embodiment will be described. Here, too, a unit circuit of an nth stage is focused on. At time point t0, an internal node VC of a unit circuit SR(n−2) of an (n−2)th stage goes into a boosted state. Therefore, the potential of an input signal VS gets very high as shown in FIG. 19. By this, a thin film transistor M1 goes into an on state.

At time point t1, a clock signal CKD changes from a low level to a high level. Since the thin film transistor M1 is already in an on state, by the change of the clock signal CKD from a low level to a high level, a bootstrap capacitor Cb is charged and the potential of an internal node VC increases. At this time, as in the above-described second embodiment, a charging voltage is a voltage corresponding to the high-level voltage of clock signals. That is, there is no reduction of an amount of voltage corresponding to the threshold voltage of the thin film transistor M1. At and after time point t2, the unit circuit SR operates in the same manner as in the above-described embodiment.

<5.3 Effects>

According to the present embodiment, an output terminal of a unit circuit of each stage is not connected to an input terminal of a unit circuit of a subsequent stage. Hence, the load on an output terminal 48 of each unit circuit SR decreases. By this, the operating voltage margin can be increased, improving the reliability of the shift register circuit 410. In addition, in the above-described fourth embodiment, in a path for pulling down an internal node VC of a given stage, three thin film transistors (a thin film transistor M3 of the given stage, a thin film transistor M2 of the given stage, and a thin film transistor M5 of a previous stage) are present. On the other hand, in the present embodiment, in a path for pulling down the internal node VC of a given stage, only two thin film transistors (a thin film transistor M3 of the given stage and a thin film transistor M2 of the given stage) are present. That is, according to the present embodiment, the operation margin regarding the operation of pulling down the internal node VC can also be increased and thus the shift register circuit 410 with higher stability is implemented.

<5.4 Variant>

Figure 20:
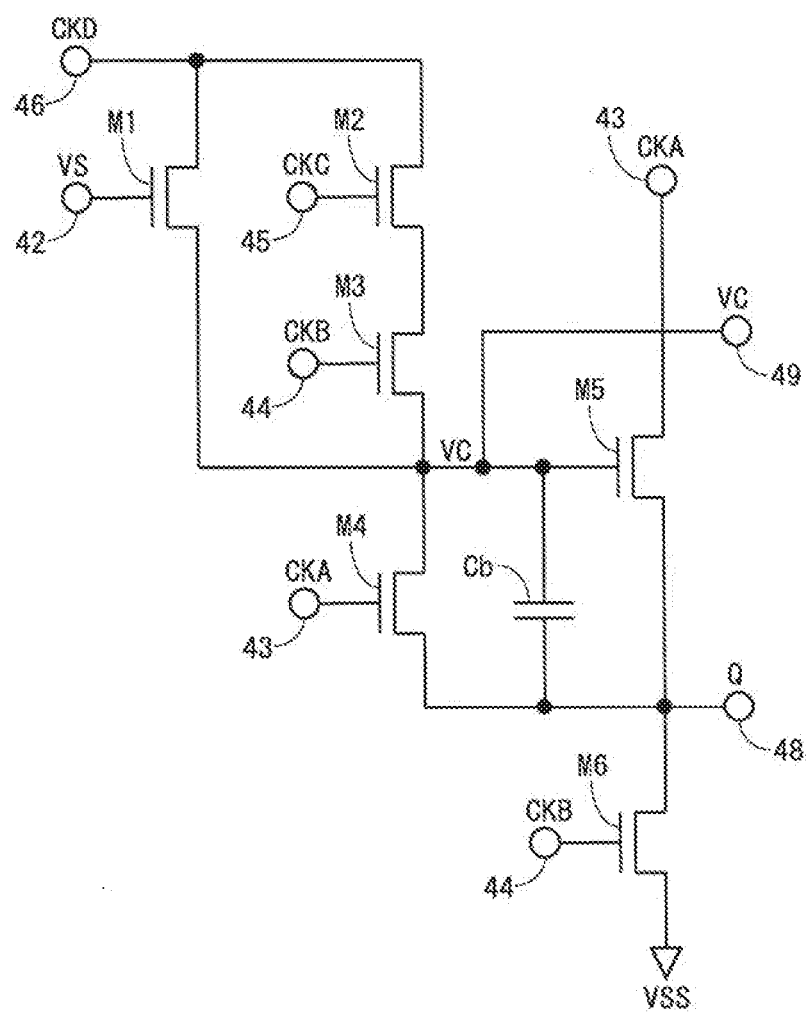
FIG. 20 is a circuit diagram showing a configuration of a unit circuit (a configuration of a portion of a shift register circuit for one stage) in a variant of the fifth embodiment.
Figure 21:
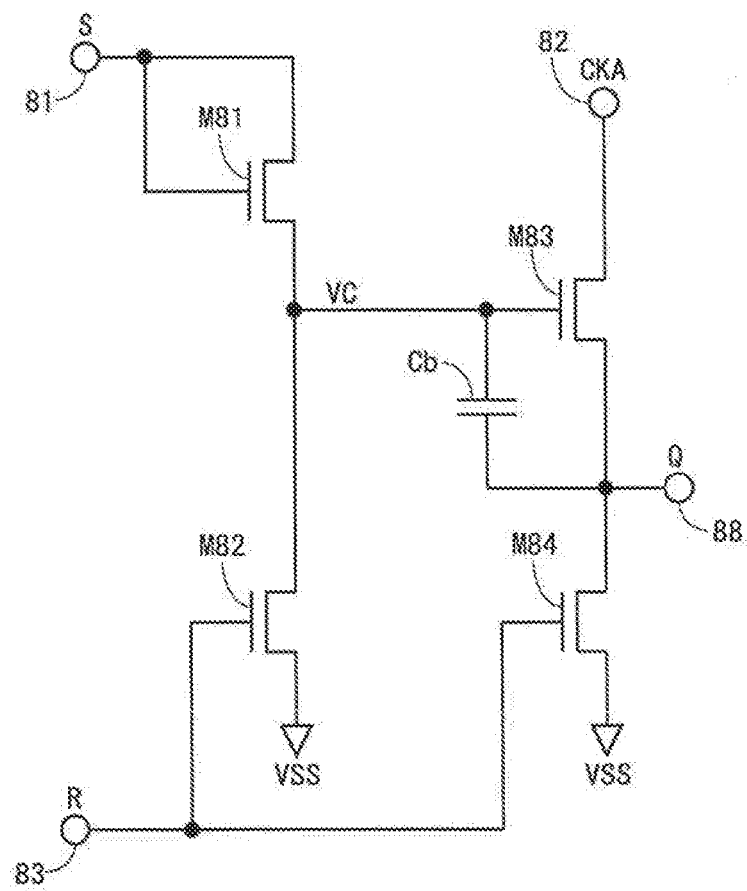
FIG. 21 is a circuit diagram showing the simplest configuration of a conventional unit circuit.
Figure 22:
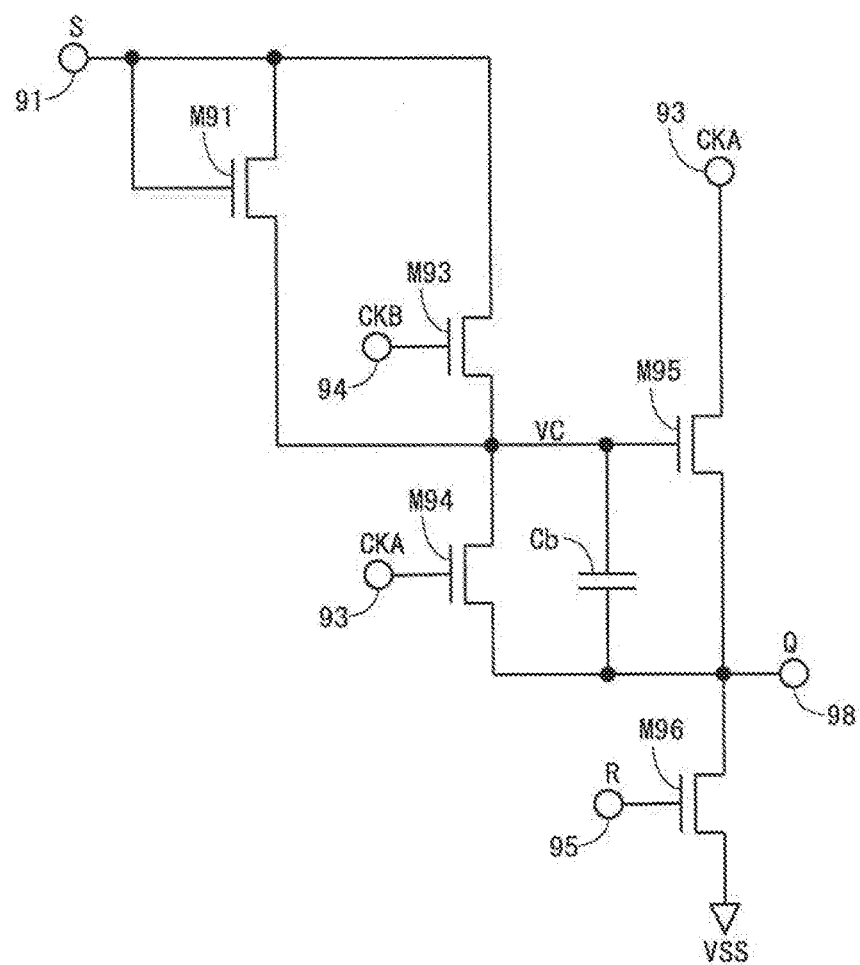
FIG. 22 is a circuit diagram showing a configuration of a unit circuit equivalent to a unit circuit disclosed in Japanese Laid-Open Patent Publication No. 2005-050502.
Figure 23:
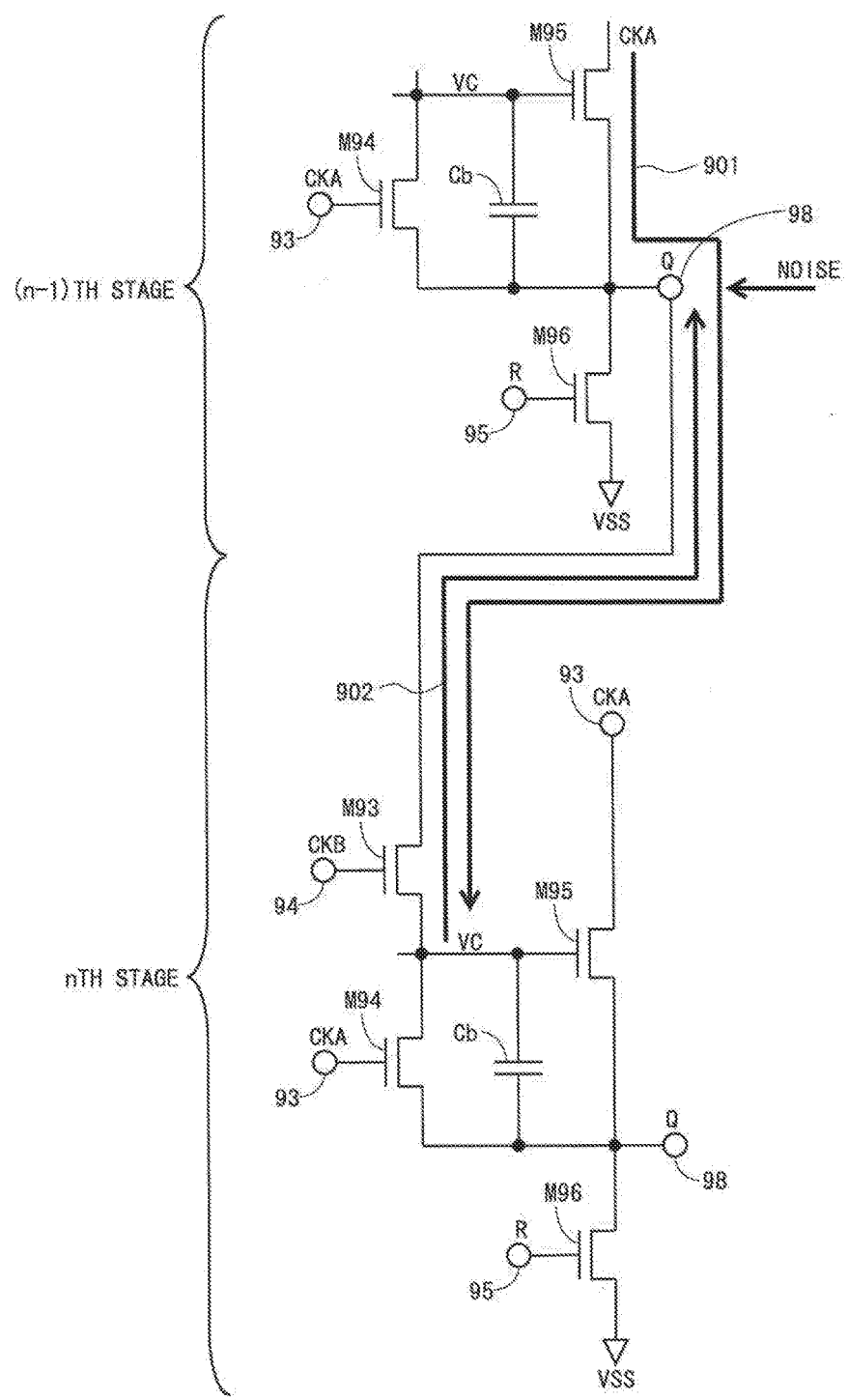
FIG. 23 is a diagram for describing the occurrence of defective operation in conventional art.

In the above-described fifth embodiment, with the configuration of the unit circuit SR in the above-described fourth embodiment (see FIG. 14) being a reference configuration, the clock signal CKD is used instead of the input signal S. However, a configuration can also be adopted in which, as shown in FIG. 20, with the configuration of the unit circuit SR in the above-described first embodiment (see FIG. 1) being a reference configuration, the clock signal CKD is used instead of the input signal S.

6. Others

Although in the above-described embodiments and variants a liquid crystal display device is described as an example, the present invention is not limited thereto. The present invention can also be applied to other display devices such as an organic EL (Electro Luminescence) display device.

DESCRIPTION OF REFERENCE CHARACTERS 41 to 47: INPUT TERMINAL (OF UNIT CIRCUIT)
48 and 49: OUTPUT TERMINAL (OF UNIT CIRCUIT)
300: SOURCE DRIVER (VIDEO SIGNAL LIME DRIVE CIRCUIT)
400: GATE DRIVER (SCANNING SIGNAL LINE DRIVE CIRCUIT)
410: SHIFT REGISTER CIRCUIT
600: DISPLAY UNIT
SR and SR(1) to SR(i): UNIT CIRCUIT
M1 to M8: THIN FILM TRANSISTOR
Cb: BOOTSTRAP CAPACITOR
VC: INTERNAL NODE
GL and GL1 to GLi: GATE BUS LINE
SL and SL1 to SLj: SOURCE BOS LINE
CK1 to CK4, CKA, CKB, CKC, and CKD: CLOCK SIGNAL
CLR: CLEAR SIGNAL

The invention claimed is:

1. A shift register circuit including a plurality of stages for driving a plurality of scanning signal lines disposed in a display unit of a display device, wherein
a unit circuit that forms each of the stages includes:
an internal node;
an output node connected to a corresponding scanning signal line;
an output control transistor having a control terminal connected to the internal node, a first conductive terminal to which an output control clock signal is provided, and a second conductive terminal connected to the output node;
an internal node precharging unit configured to precharge the internal node based on an on-level signal outputted from an output node of a preceding stage;
an internal node pulling down unit configured to pull down the internal node; and
an output node pulling down unit configured to pull down the output node, and
the internal node pulling down unit:
pulls down the internal node of a stage by electrically connecting the internal node of this stage to the output node of a previous stage during at least a part of a period during which the output node of the previous stage is pulled down; and
allows the internal node of this stage and the output node of the previous stage to be electrically disconnected from each other throughout a period during which an output control clock signal is at an on level, the output control clock signal being provided to a first conductive terminal of an output control transistor of the previous stage;
wherein the previous stage is one stage of the plurality of stages immediately before the stage; and
wherein the preceding stage is any one stage of the plurality of stages before this stage.

2. The shift register circuit according to claim 1, wherein the internal node pulling down unit pulls down the internal node for about a quarter period of a clock cycle, based on a plurality of clock signals with different phases, the plurality of clock signals being included in four-phase clock signals.

3. The shift register circuit according to claim 2, wherein the internal node pulling down unit includes two transistors connected in series with each other between the internal node of this stage and the output node of the previous stage.

4. The shift register circuit according to claim 3, wherein the internal node pulling down unit includes, as the two transistors,
a first internal node pull-down transistor having a control terminal to which a clock signal of an opposite phase to the output control clock signal that is provided to the first conductive terminal of the output control transistor of the previous stage is provided; and
a second internal node pull-down transistor having a control terminal to which a clock signal delayed in phase by 90 degrees relative to the output control clock signal that is provided to the first conductive terminal of the output control transistor of the previous stage is provided.

5. The shift register circuit according to claim 4, wherein the output node pulling down unit pulls down the output node for about a half period of a clock cycle, based on the clock signal of the opposite phase to the output control clock signal.

6. The shift register circuit according to claim 5, wherein the output node pulling down unit includes an output node pull-down transistor having a control terminal to which the clock signal of the opposite phase to the output control clock signal is provided, a first conductive terminal connected to the output node, and a second conductive terminal to which the output control clock signal is provided.

7. The shift register circuit according to claim 1, wherein the unit circuit that forms each of the stages further includes a third internal node pull-down transistor having a first conductive terminal connected to the internal node and a second conductive terminal connected to the output node.

8. The shift register circuit according to claim 7, wherein the output control clock signal is provided to a control terminal of the third internal node pull-down transistor.

9. The shift register circuit according to claim 1, wherein the internal node precharging unit precharges the internal node based on a signal representing a level of an internal node of a stage located two stages before this stage and a signal outputted from the output node of the previous stage.

10. The shift register circuit according to claim 1, wherein the infernal node precharging unit includes an internal node precharge transistor having a control terminal and a first conductive terminal that are connected to the output node of the previous stage, and a second conductive terminal connected to the internal node of this stage.

11. The shift register circuit according to claim 1, wherein the unit circuit that forms each of the stages further includes an initializing unit configured to pull down both the internal node and the output node.

12. The shift register circuit according to claim 11, wherein the initializing unit includes:
a first initialization transistor having a control terminal to which an initialization signal is provided, a first conductive terminal connected to the internal node, and a second conductive terminal connected to the output node; and
a second initialization transistor having a control terminal to which the initialization signal is provided, a first conductive terminal connected to the output node, and a second conductive terminal to which the output control clock signal is provided.

13. The shift register circuit according to claim 1, wherein the output control transistor is a thin film transistor having a channel layer formed of an oxide semiconductor.

14. A display device comprising a shift register circuit according to claim 1.

15. A shift register circuit including a plurality of stages for driving a plurality of scanning signal lines disposed in a display unit of a display device, wherein
a unit circuit that forms each of the stages includes:
an internal node;
an output node connected to a corresponding scanning signal line;
an output control transistor having a control terminal connected to the internal node, having a first conductive terminal to which an output control clock signal is provided, and a second conductive terminal connected to the output node;
an internal node precharging unit configured to precharge the internal node based on an on-level signal outputted from an output node of a preceding stage;
an internal node pulling down unit configured to pull down the internal node; and
an output node pulling down unit configured to pull down the output node, and
the internal node pulling down unit:
includes a clock terminal configured to receive a clock signal that is provided, as an output control clock signal, to a first conductive terminal of an output control transistor of a previous stage;
pulls down the internal node of a stage by electrically connecting the internal node of this stage to the clock terminal during at least a part of a period during which the output control clock signal provided to the first conductive terminal of the output control transistor of the previous stage is at an off level; and
allows the internal node of this stage and the clock terminal to be electrically disconnected from each other throughout a period during which the output control clock signal provided to the first conductive terminal of the output control transistor of the previous stage is at an on level;

wherein the previous stage is one stage of the plurality of stages immediately before this stage; and wherein the preceding stage is any one stage of the plurality of stages before this stage.

16. A display device comprising a shift register circuit according to claim 15.

* * * * *